US012080709B2

(12) United States Patent
Mukesh et al.

(10) Patent No.: US 12,080,709 B2
(45) Date of Patent: Sep. 3, 2024

(54) DUAL INNER SPACER EPITAXY IN MONOLITHIC STACKED FETS

(71) Applicant: International Business Machines Corporation, Armonk, NY (US)

(72) Inventors: Sagarika Mukesh, Albany, NY (US); Julien Frougier, Albany, NY (US); Nicolas Jean Loubet, Guilderland, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 403 days.

(21) Appl. No.: 17/655,595

(22) Filed: Mar. 21, 2022

(65) Prior Publication Data
US 2023/0299080 A1    Sep. 21, 2023

(51) Int. Cl.
*H01L 27/06* (2006.01)
*H01L 21/822* (2006.01)
*H01L 27/12* (2006.01)
*H01L 29/786* (2006.01)

(52) U.S. Cl.
CPC ...... *H01L 27/0688* (2013.01); *H01L 21/8221* (2013.01); *H01L 27/1222* (2013.01); *H01L 27/1251* (2013.01); *H01L 27/127* (2013.01); *H01L 29/78696* (2013.01)

(58) Field of Classification Search
None
See application file for complete search history.

(56) References Cited

U.S. PATENT DOCUMENTS

| 8,674,470 | B1 | 3/2014 | Or-Bach et al. |
| 9,397,226 | B2 | 7/2016 | Basu et al. |
| 9,799,748 | B1 | 10/2017 | Xie et al. |
| 9,837,491 | B2 | 12/2017 | Rosenblatt et al. |
| 10,192,819 | B1 | 1/2019 | Chanemougame et al. |

(Continued)

FOREIGN PATENT DOCUMENTS

| CN | 111261521 A | 6/2020 | |
| EP | 3979306 A1 * | 4/2022 | ......... H01L 21/8221 |

OTHER PUBLICATIONS

Barbe et al., "Stacked Nanowires/Nanosheets GAA MOSFET from Technology to Design Enablement," In 2017 International Conference on Simulation of Semiconductor Processes and Devices (SISPAD) (pp. 5-8). IEEE.

(Continued)

*Primary Examiner* — Cory W Eskridge
(74) *Attorney, Agent, or Firm* — David K. Mattheis

(57) ABSTRACT

A semiconductor device includes a bottom device, a top device, and a spacer. The bottom device includes a first set of silicon sheets and a first source-drain epitaxy in direct contact with the first set of silicon sheets. The top device includes a second set of silicon sheets, a set of separation layers, and a second source-drain epitaxy. Each silicon sheet of the second set of silicon sheets is separated by a separation layer of the set of separation layers. The second source-drain epitaxy is arranged in direct contact with the second set of silicon sheets. The spacer is arranged between the first source-drain epitaxy and the second source-drain epitaxy and is arranged between each silicon sheet of the second set of silicon sheets.

20 Claims, 32 Drawing Sheets

(56) References Cited

U.S. PATENT DOCUMENTS

| | | |
|---|---|---|
| 10,192,867 B1 | 1/2019 | Frougier et al. |
| 10,510,622 B1 | 12/2019 | Frougier et al. |
| 10,679,906 B2 | 6/2020 | Cheng et al. |
| 11,088,246 B2 | 8/2021 | Passlack et al. |
| 2021/0313235 A1 | 10/2021 | Liao |
| 2021/0320035 A1* | 10/2021 | Xie ................. H01L 21/823842 |

OTHER PUBLICATIONS

Nguyen et al., "Pinch Off Plasma CVD Deposition Process and Material Technology for Nano-Device Air Gap/Spacer Formation," ECS Journal of Solid State Science and Technology, 7(10), P588, 7 pgs., 2018.

Ryckaert, et al., "The Complementary FET (CFET) for CMOS scaling beyond N3m," 2018 IEEE Symposium on VLSI Technology, 2018, pp. 141-142, doi: 10.1109/VLSIT.2018.8510618.

International Search Report and Written Opinion dated May 16, 2023, for International Application No. PCT/CN2023/074971, filed Feb. 8, 2023.

* cited by examiner

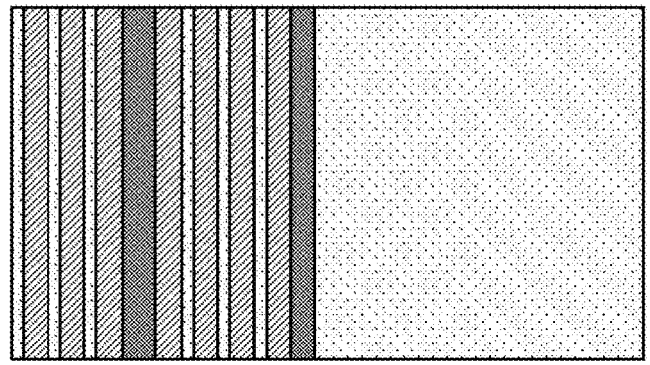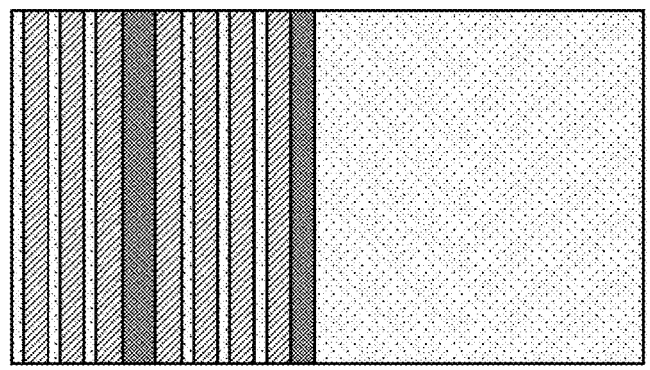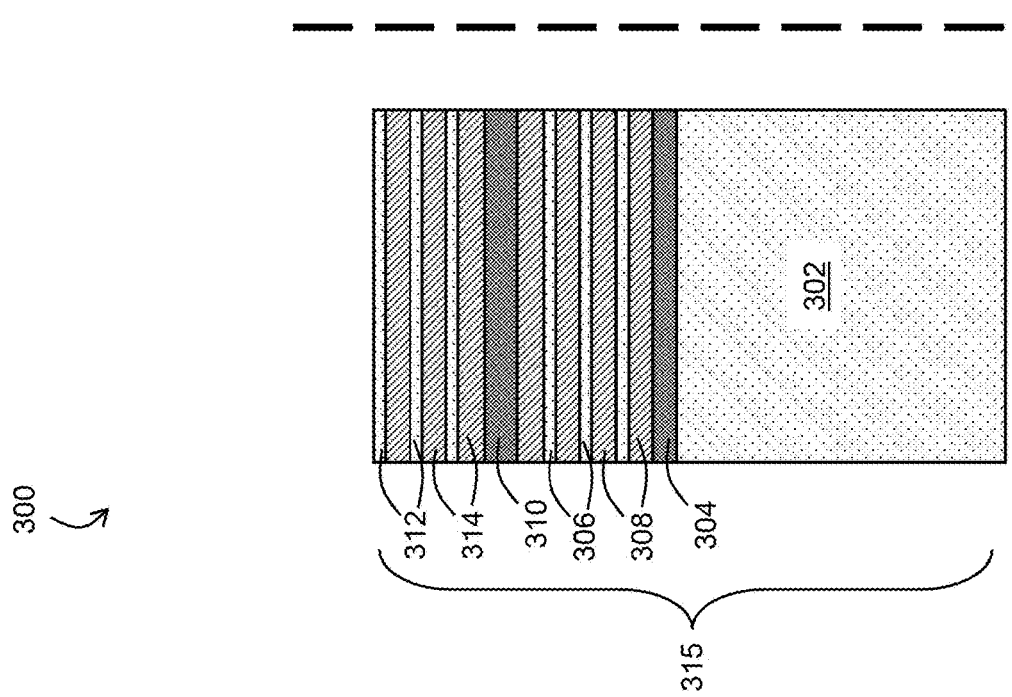
FIG. 3

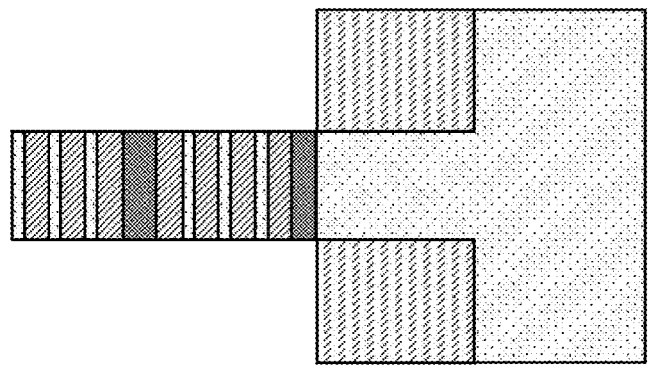
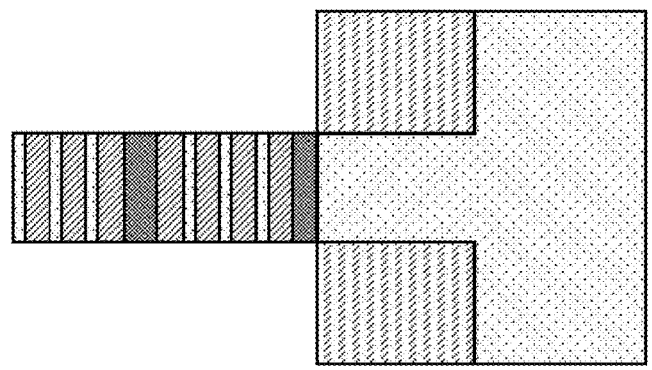
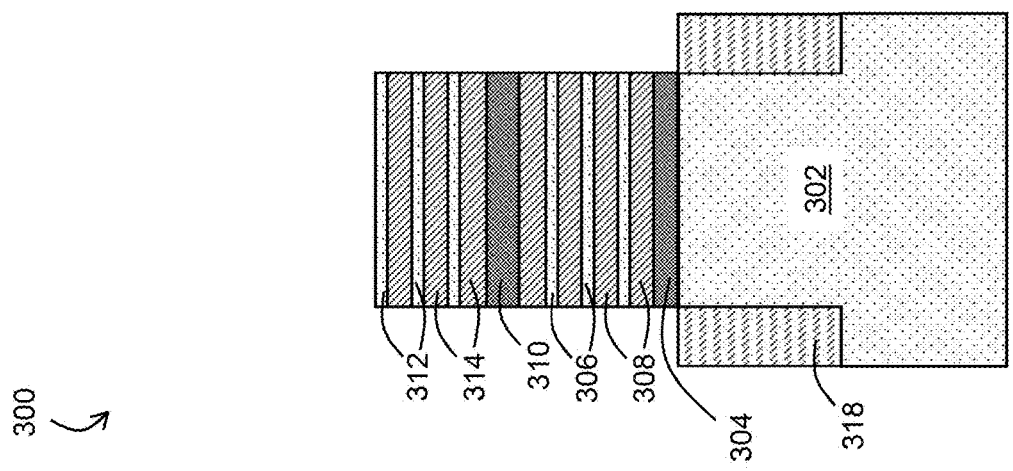
FIG. 5

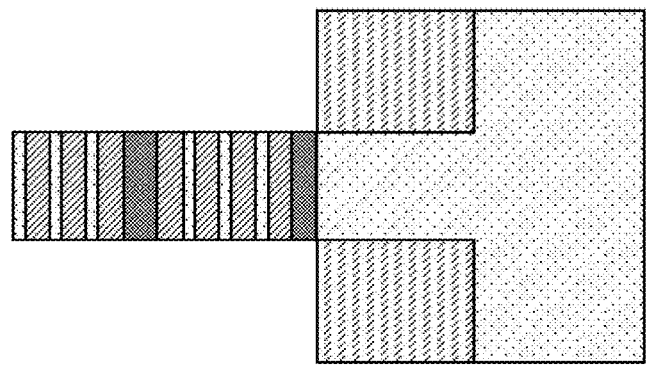
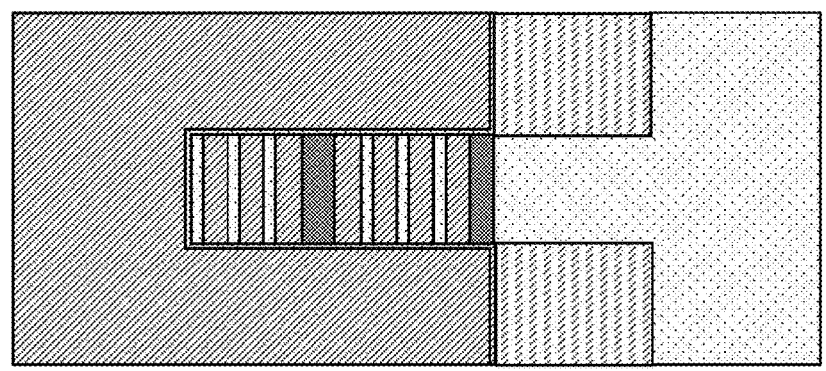
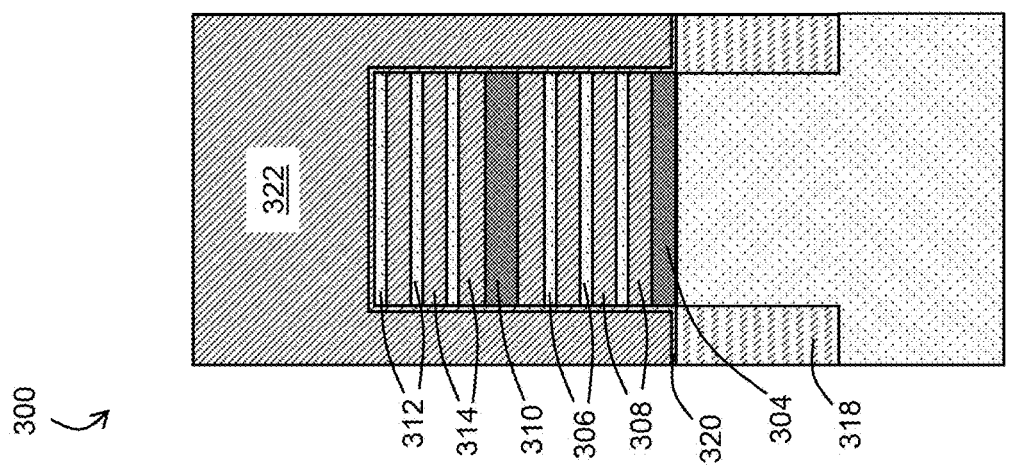
FIG. 6

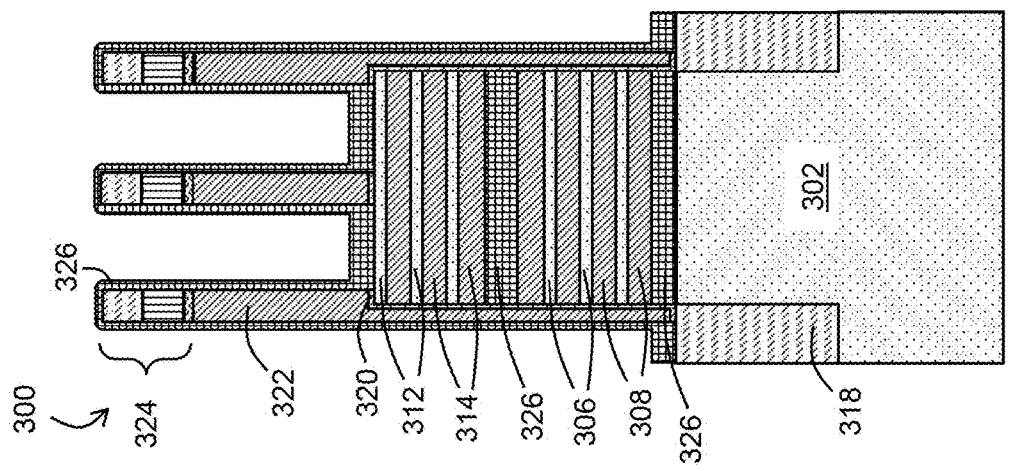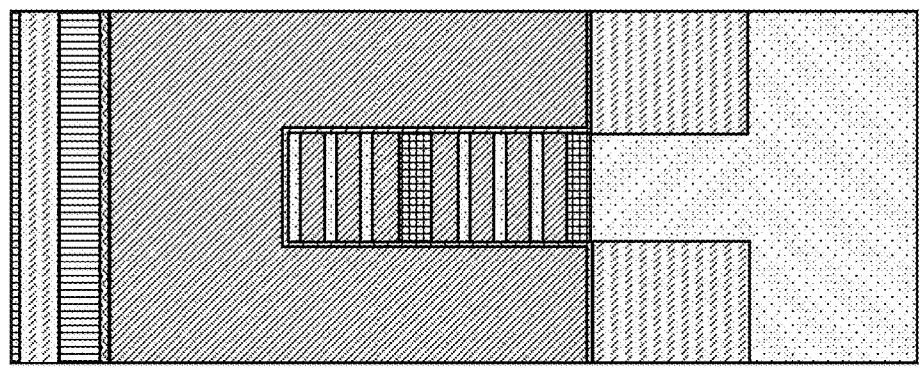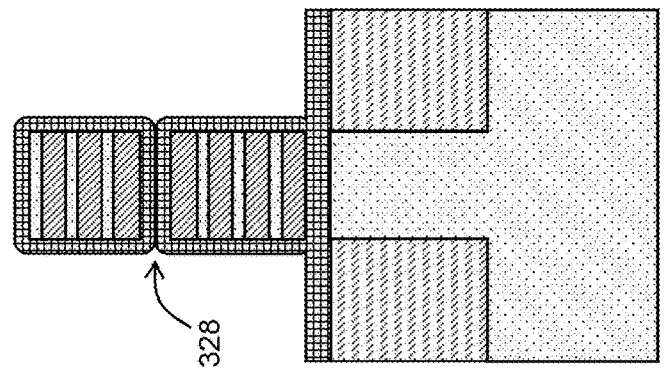
FIG. 9

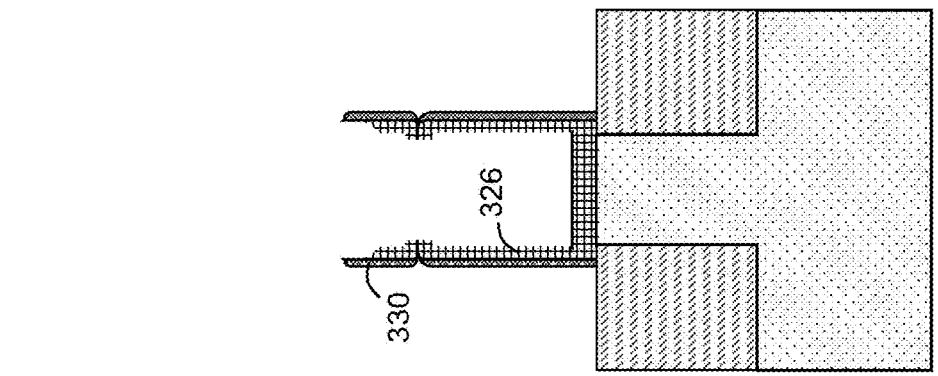
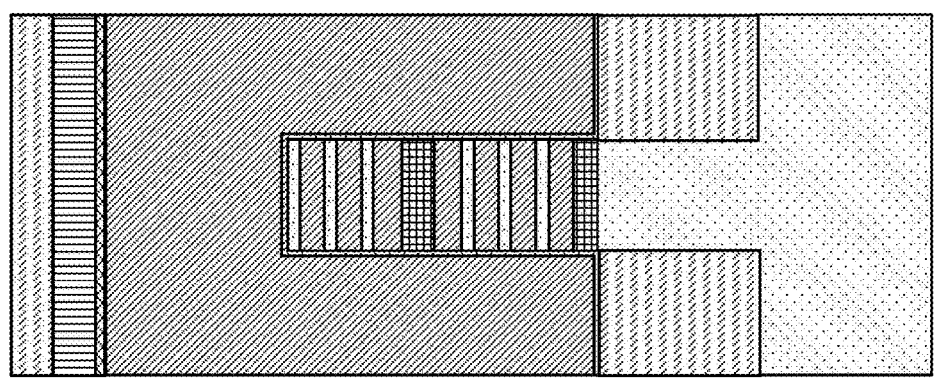
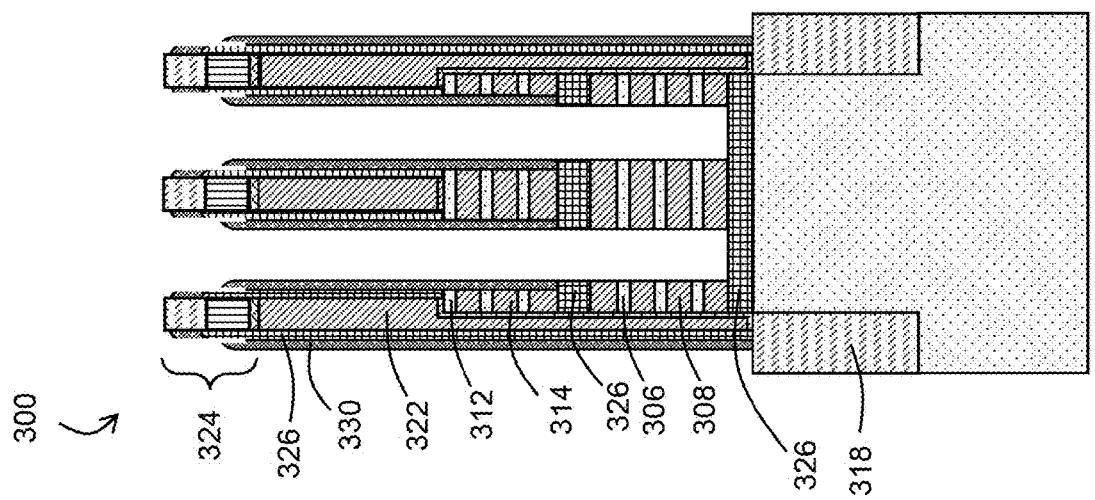
FIG. 12

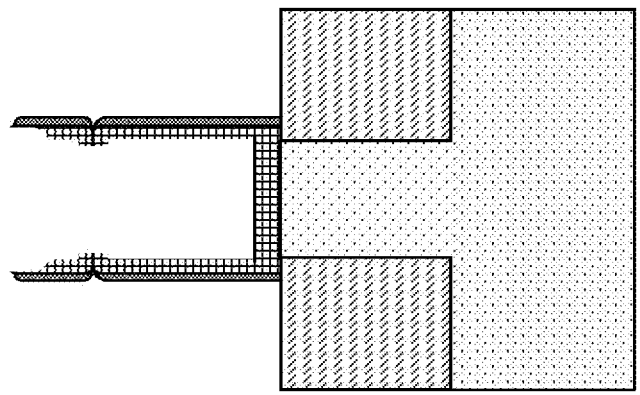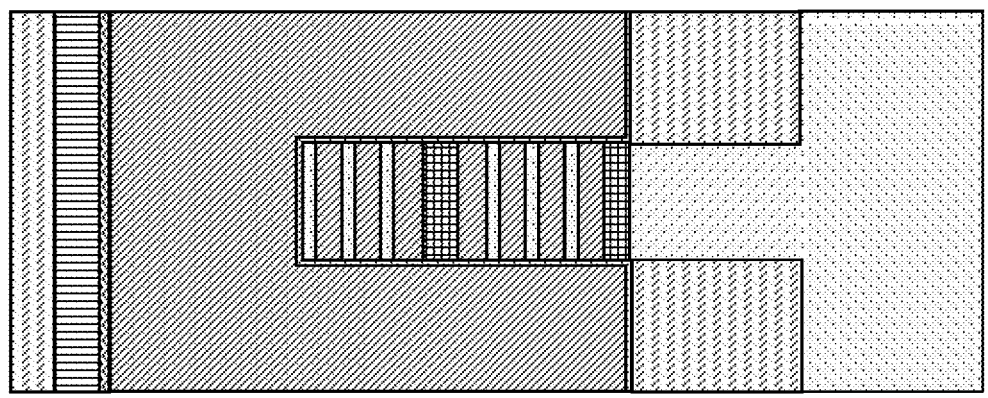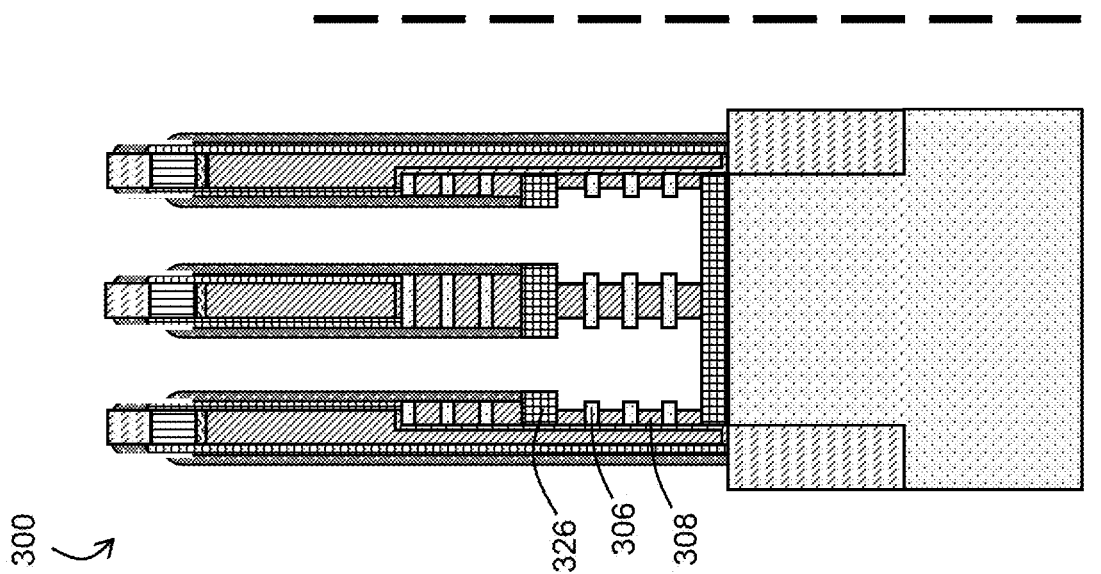
FIG. 14

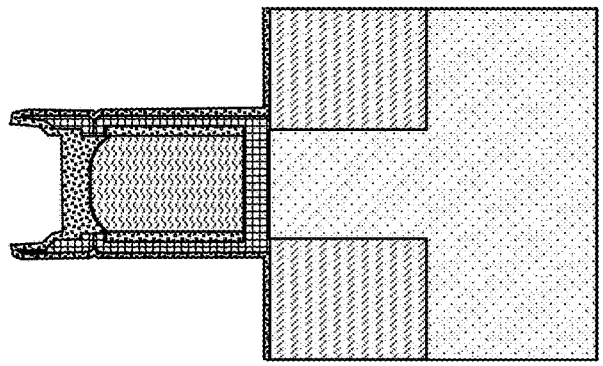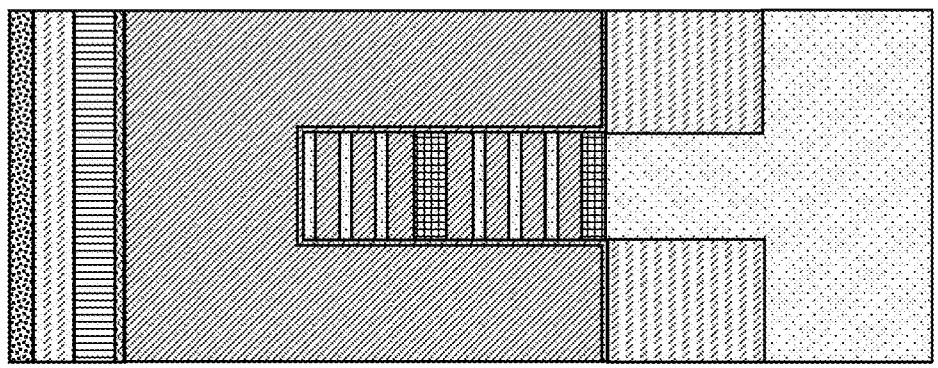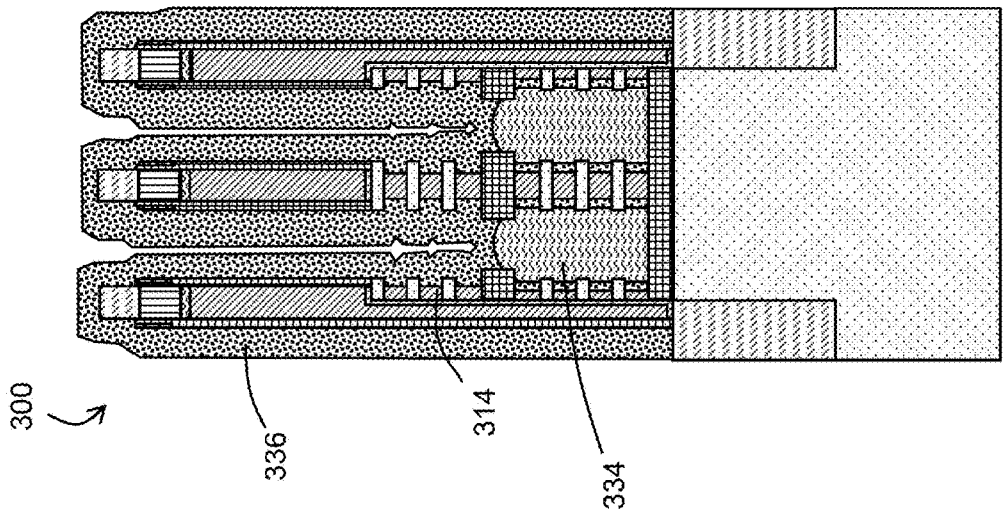
FIG. 19

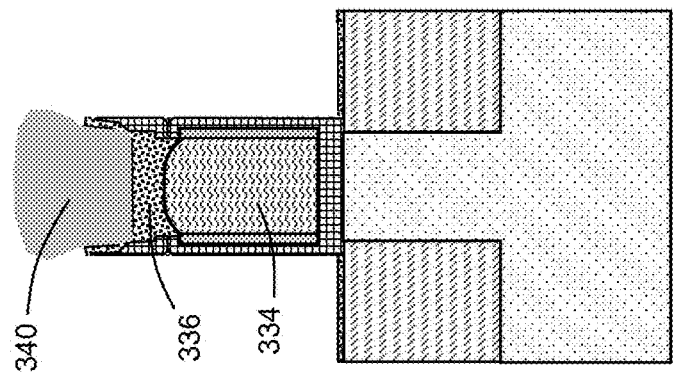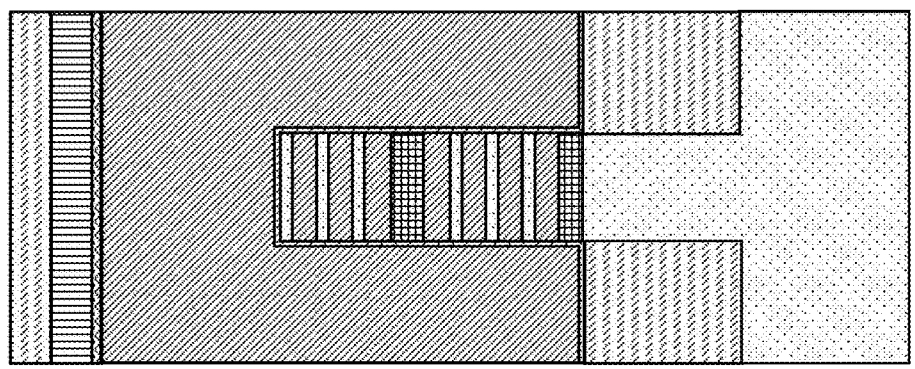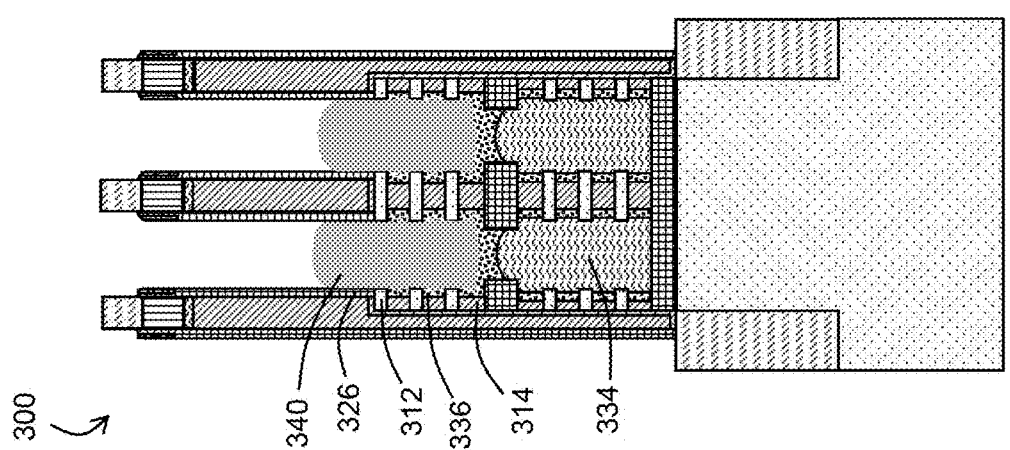
FIG. 22

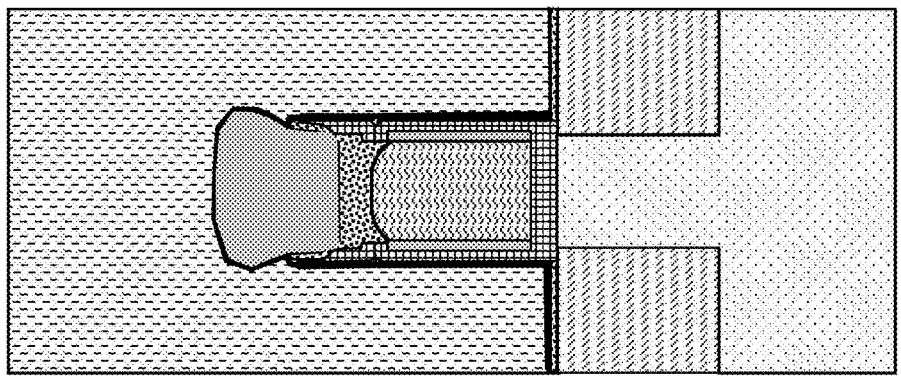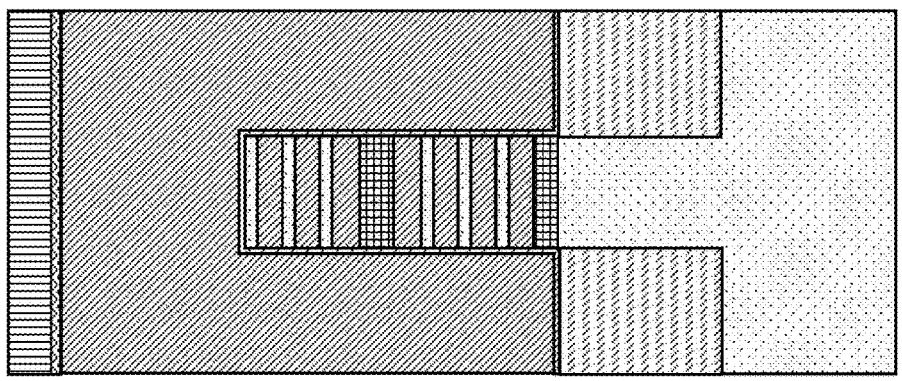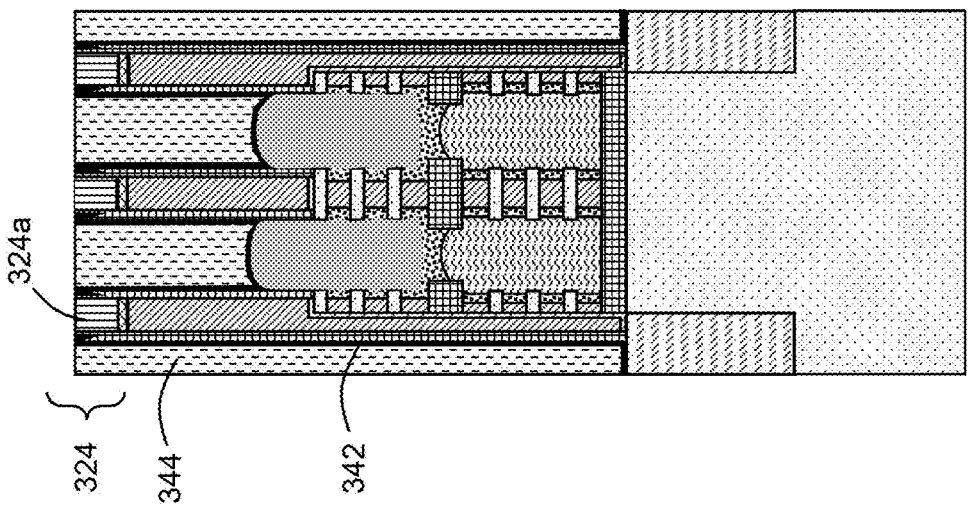
FIG. 23

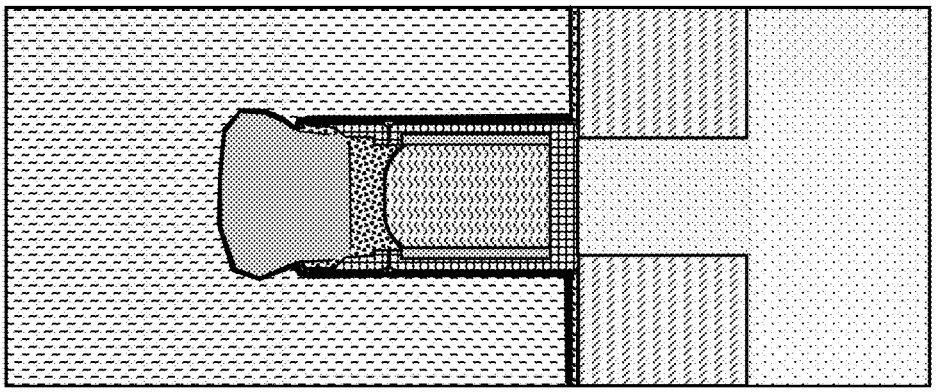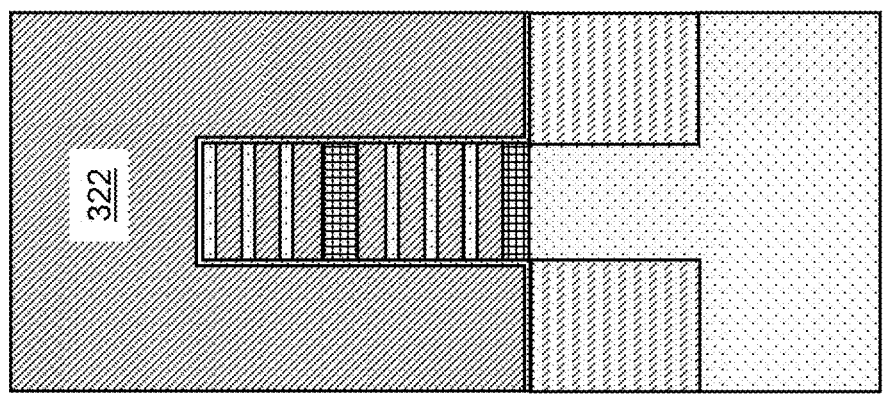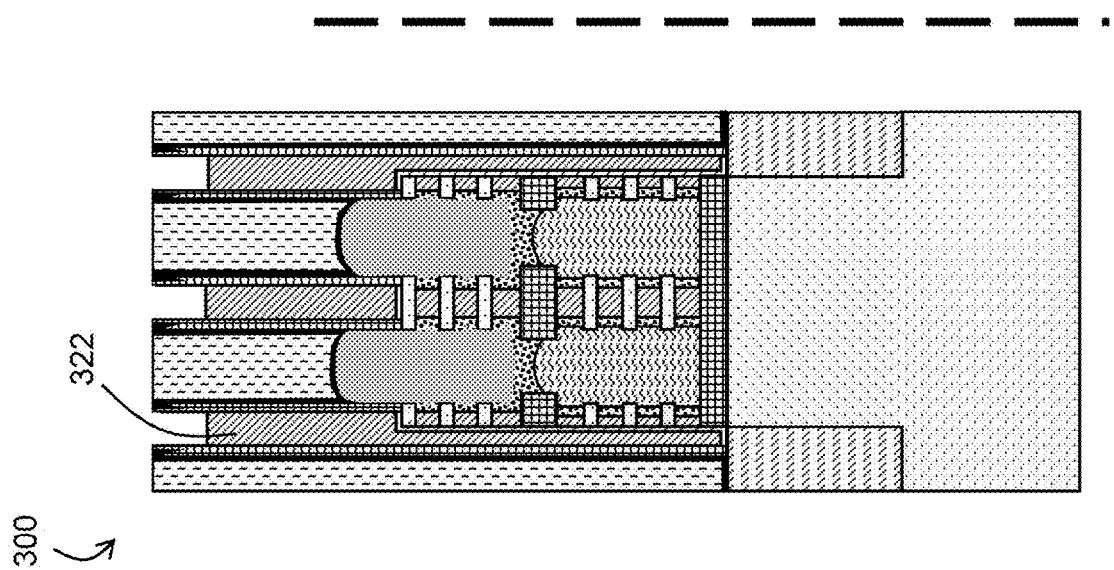
FIG. 24

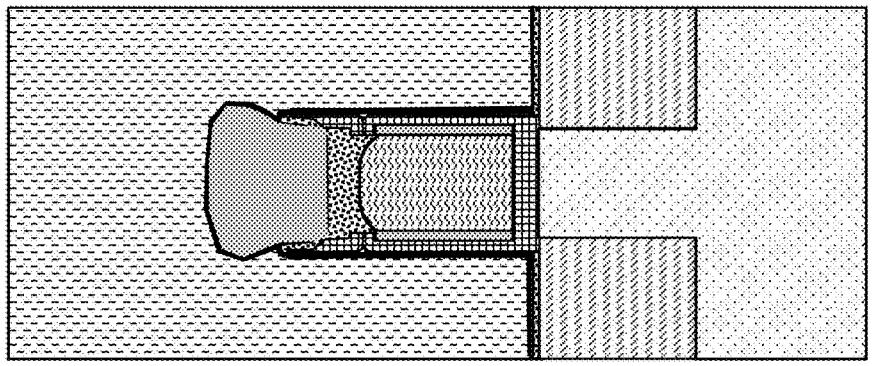
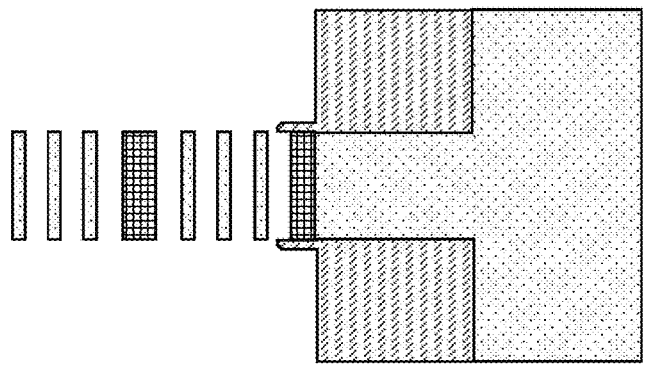
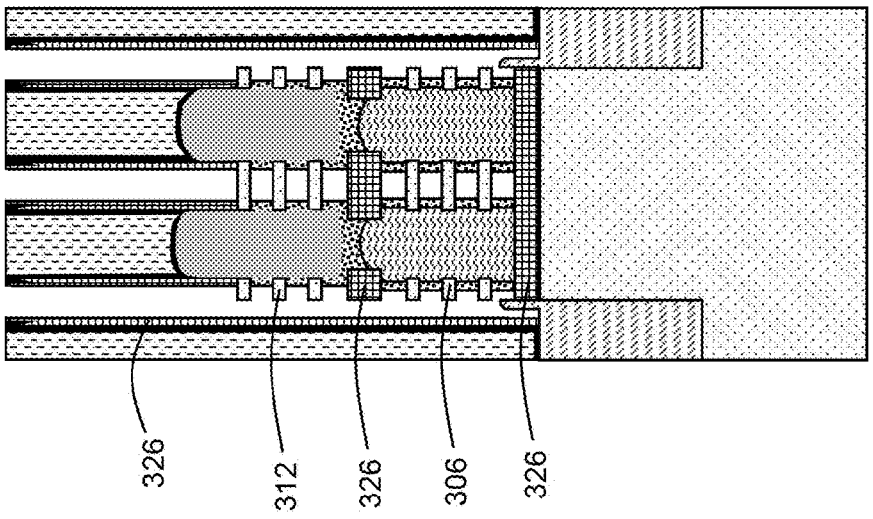
FIG. 25

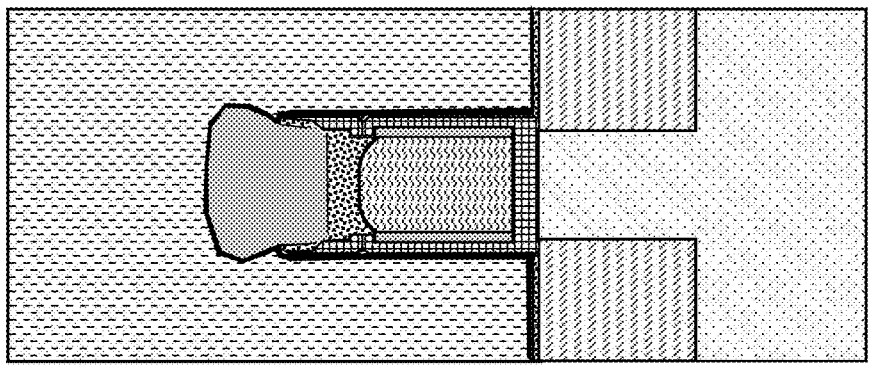
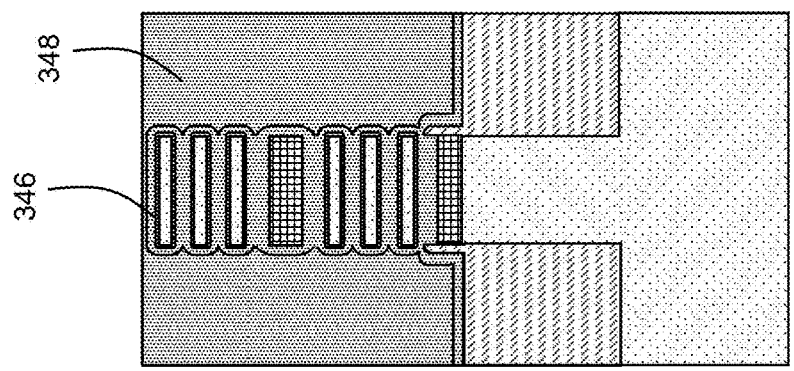
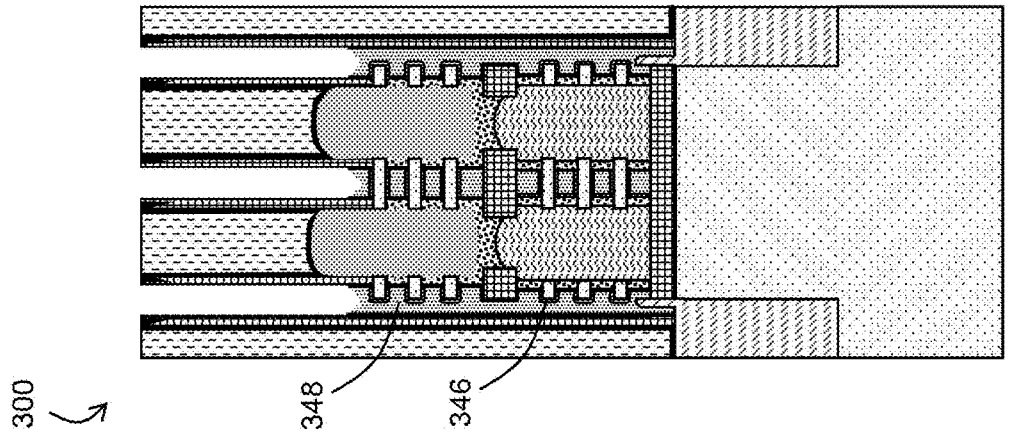
FIG. 26

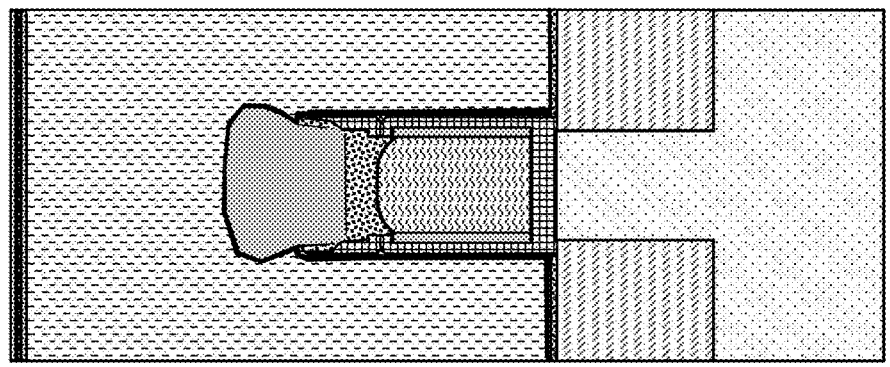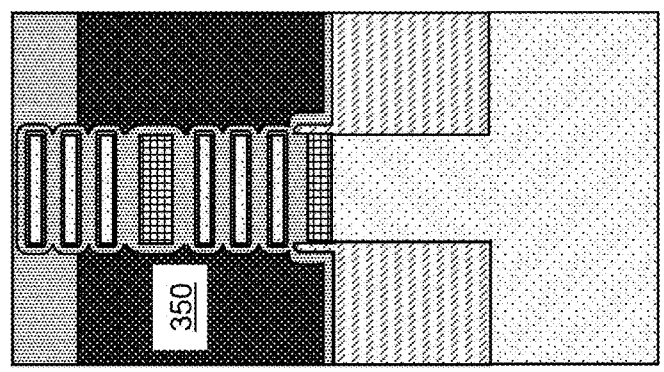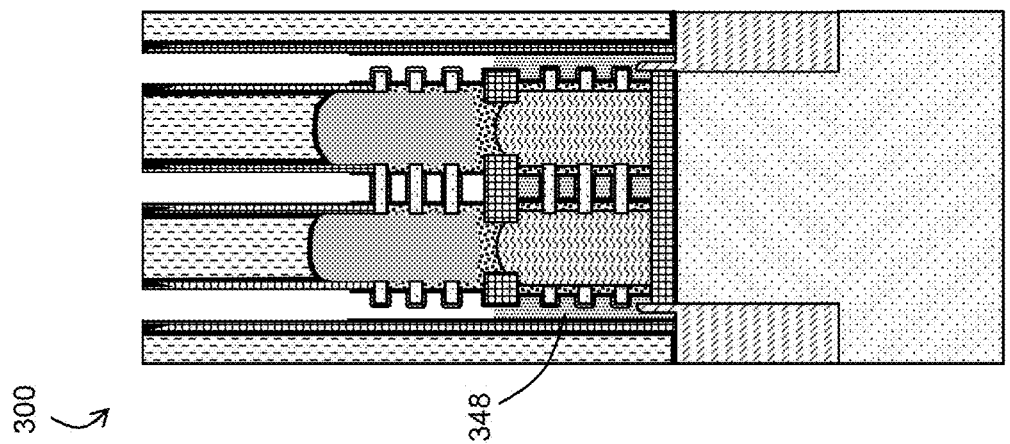
FIG. 27

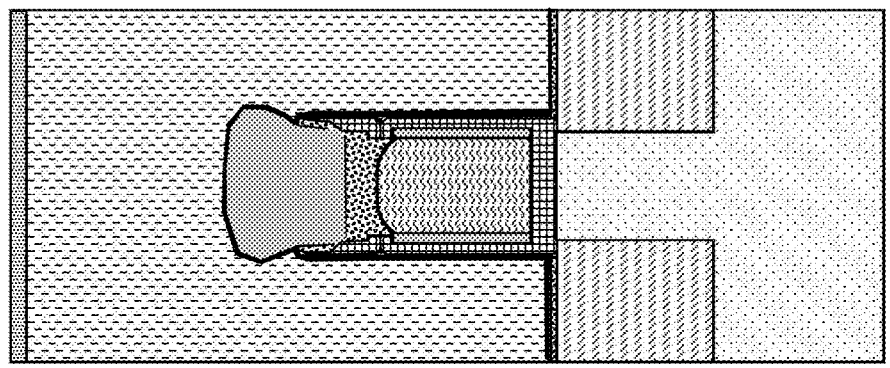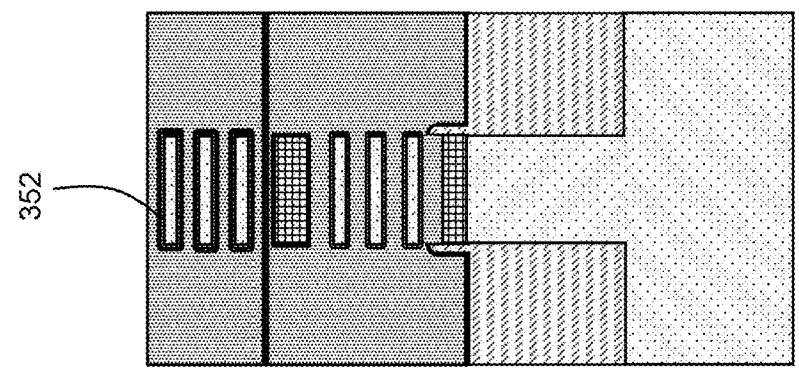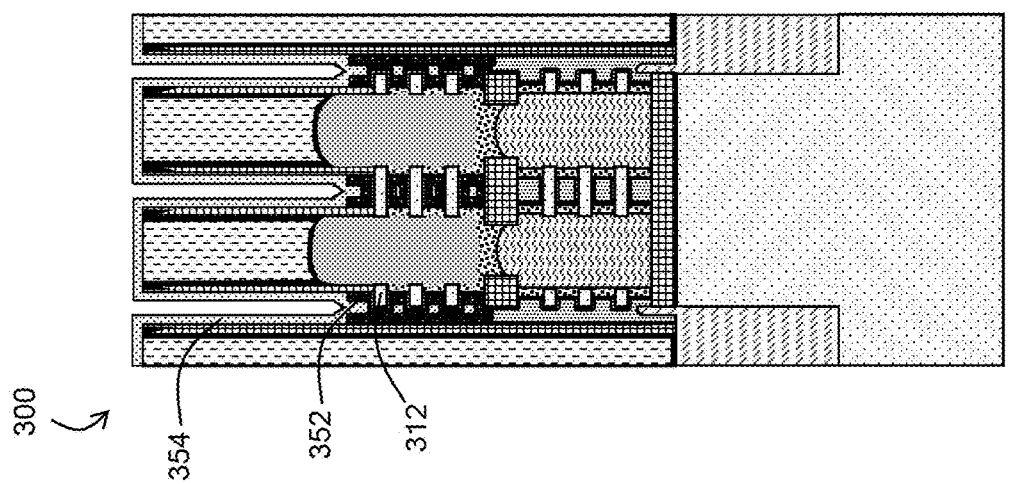
FIG. 28

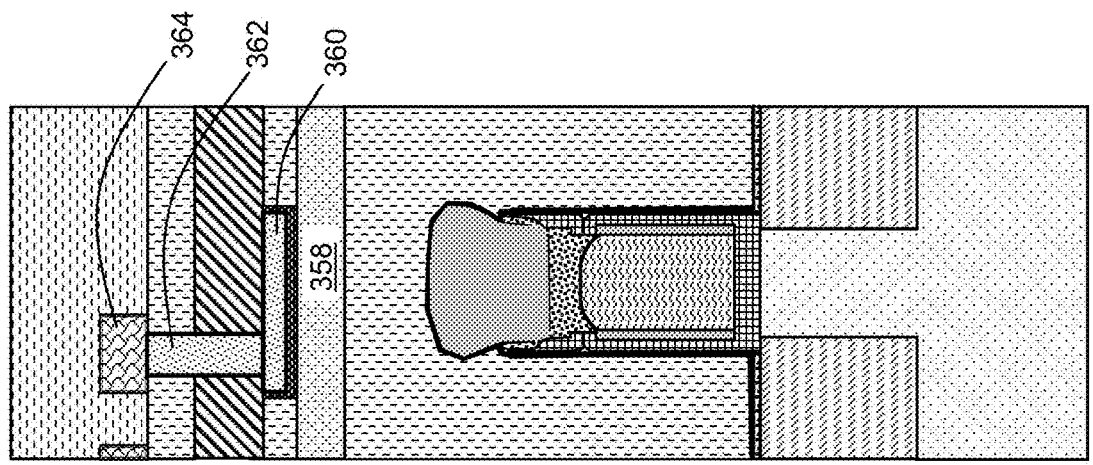
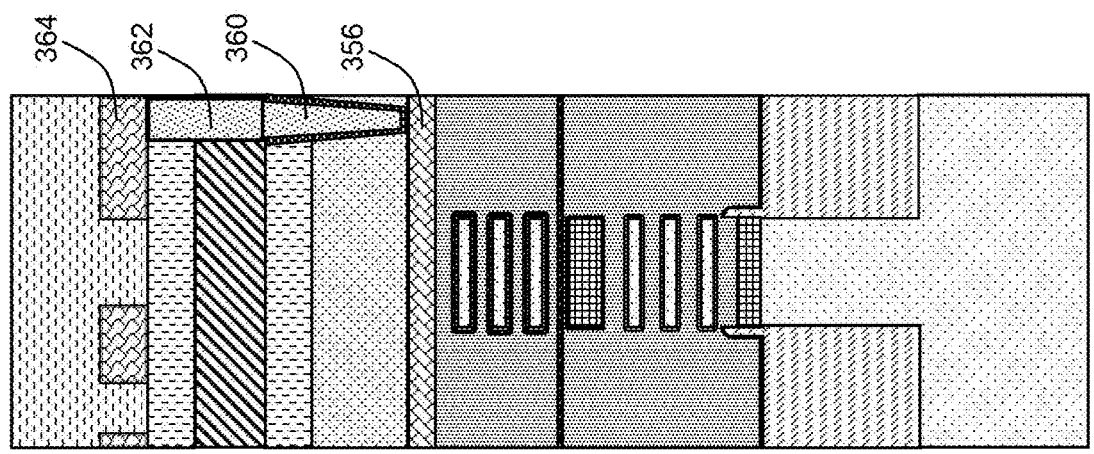
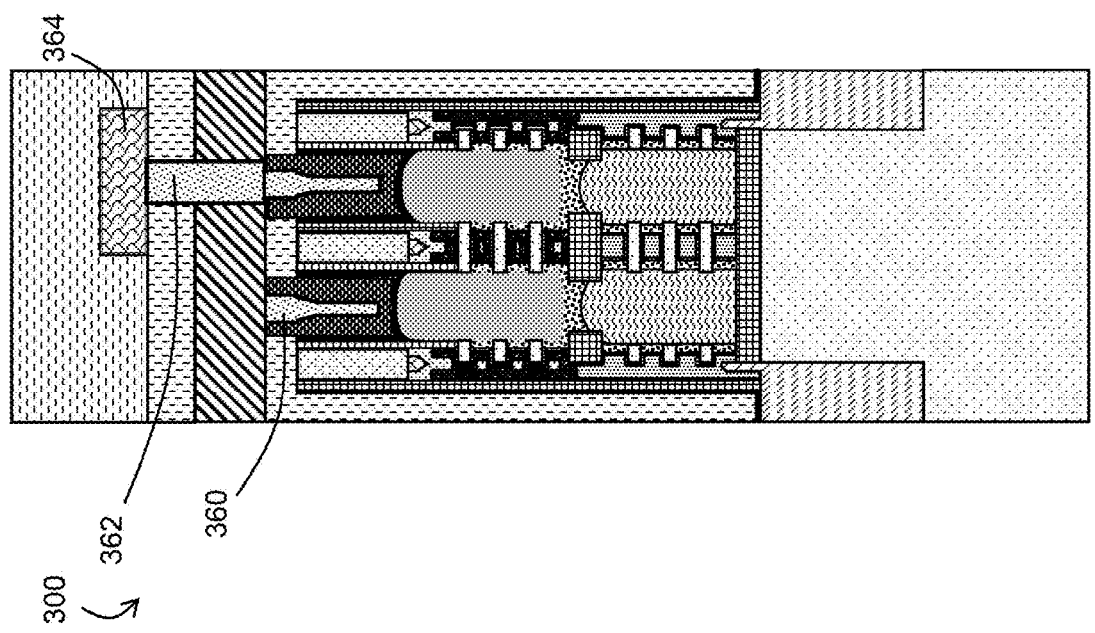
FIG. 30

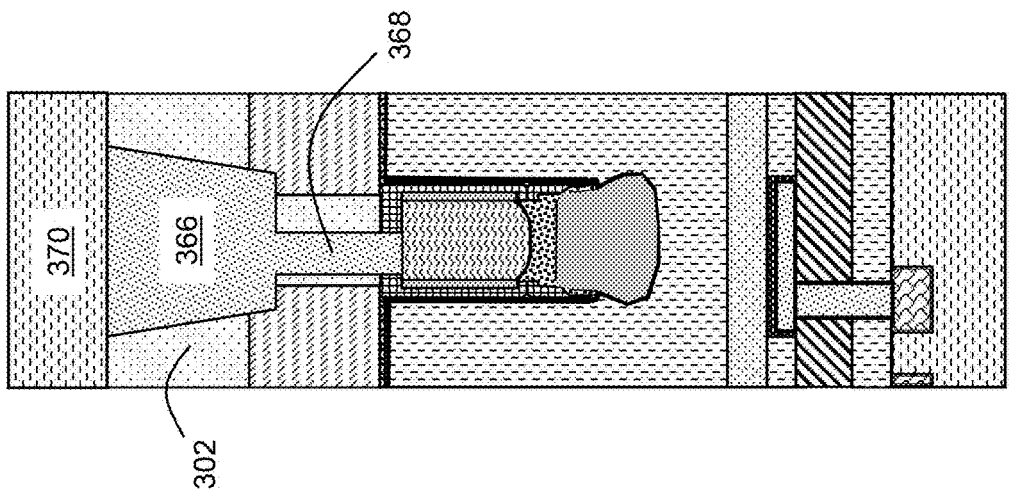
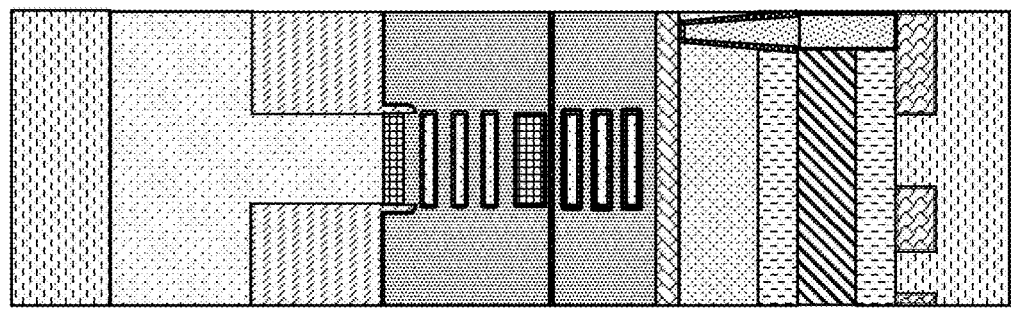
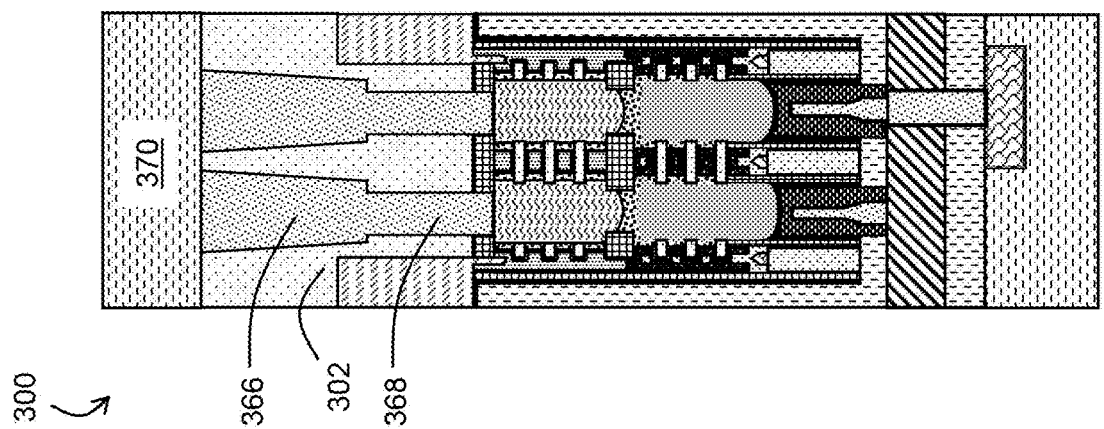
FIG. 31

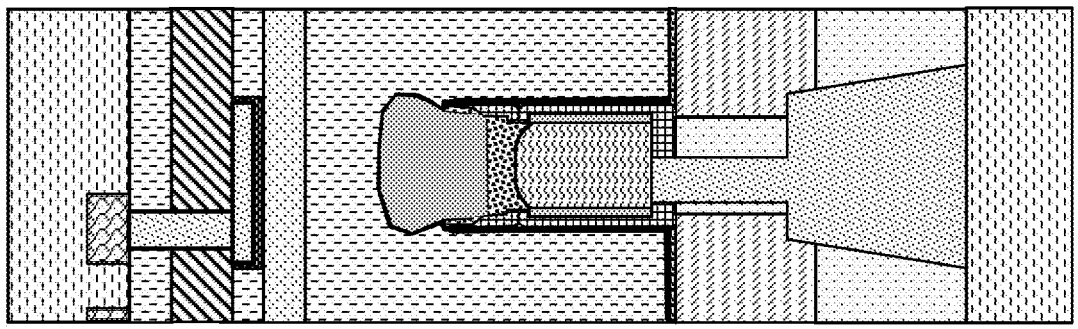
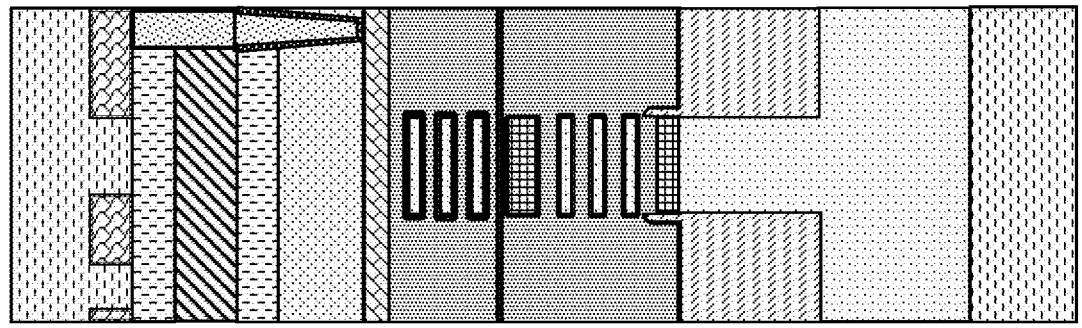
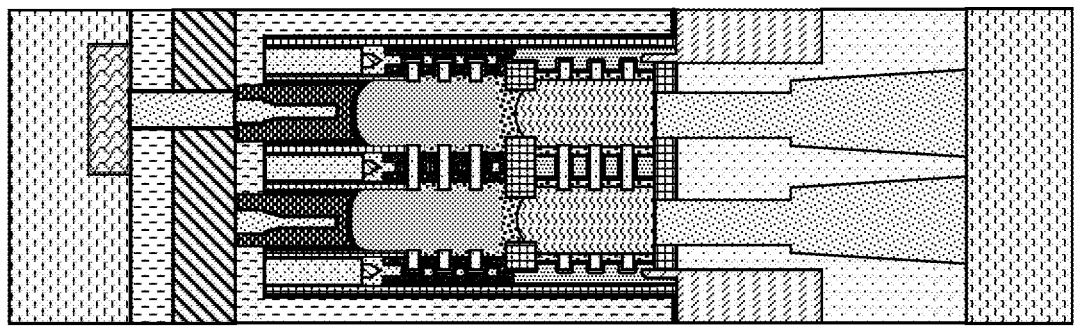
FIG. 32

DUAL INNER SPACER EPITAXY IN MONOLITHIC STACKED FETS

BACKGROUND

The present disclosure relates to the semiconductor device fields. In particular, the present disclosure relates to semiconductor devices having stacked transistors.

A field-effect transistor (FET), sometimes called a unipolar transistor, uses either electrons (in an n-channel FET, also referred to as an nFET) or holes (in a p-channel FET, also referred to as a pFET) for conduction. The four terminals of the FET are referred to as the source, gate, drain, and body, which may also be referred to as the substrate. In a FET, the drain-to-source current flows via a conducting channel that connects the source region to the drain region. The conductivity is varied by the electric field that is produced when a voltage is applied between the gate and source terminals. Accordingly, the current flowing between the drain and source is controlled by the voltage applied between the gate and source.

Relative to transistors produced from a single semiconductor layer, a stacked structure makes it possible to increase the integration density of the transistors in the integrated circuit.

SUMMARY

Embodiments of the present disclosure include a semiconductor device. The semiconductor device includes a bottom device including a first set of silicon sheets and a first source-drain epitaxy in direct contact with the first set of silicon sheets. The semiconductor device further includes a top device including a second set of silicon sheets, a set of separation layers, and a second source-drain epitaxy. Each silicon sheet of the second set of silicon sheets is separated by a separation layer of the set of separation layers. The second source-drain epitaxy arranged in direct contact with the second set of silicon sheets. The semiconductor device further includes a spacer arranged between the first source-drain epitaxy and the second source-drain epitaxy and arranged between each silicon sheet of the second set of silicon sheets.

Additional embodiments of the present disclosure include a method for forming a stacked transistor. The method includes forming a bottom device including a first set of silicon sheets and a first source-drain epitaxy in direct contact with the first set of silicon sheets. The method further includes forming a top device including a second set of silicon sheets, a set of separation layers, and a second source-drain epitaxy. Each silicon sheet of the second set of silicon sheets is separated by a separation layer of the set of separation layers, and the source-drain epitaxy is arranged in direct contact with the second set of silicon sheets. The method further includes forming a spacer arranged between the first source-drain epitaxy and the second source-drain epitaxy and arranged between the second source-drain epitaxy and the set of separation layers.

Additional embodiments of the present disclosure include a stacked transistor. The stacked transistor includes a bottom device including a first plurality of silicon sheets and a bottom source-drain epitaxy. The stacked transistor further includes a top device including a second plurality of silicon sheets and a top source-drain epitaxy. The stacked transistor further includes a spacer arranged between the bottom source-drain epitaxy and the top source-drain epitaxy and arranged between the silicon sheets of the second plurality of silicon sheets.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIG. 3 illustrates a cross-sectional schematic view of an example of a structure following the performance of a portion of the example method of FIG. 1, in accordance with embodiments of the present disclosure.

FIG. 5 illustrates a cross-sectional schematic view of an example of a structure following the performance of a portion of the example method of FIG. 1, in accordance with embodiments of the present disclosure.

FIG. 6 illustrates a cross-sectional schematic view of an example of a structure following the performance of a portion of the example method of FIG. 1, in accordance with embodiments of the present disclosure.

FIG. 9 illustrates a cross-sectional schematic view of an example of a structure following the performance of a portion of the example method of FIG. 1, in accordance with embodiments of the present disclosure.

FIG. 12 illustrates a cross-sectional schematic view of an example of a structure following the performance of a portion of the example method of FIG. 1, in accordance with embodiments of the present disclosure.

FIG. 14 illustrates a cross-sectional schematic view of an example of a structure embodiments of the present disclosure.

FIG. 19 illustrates a cross-sectional schematic view of an example of a structure following the performance of a portion of the example method of FIG. 1, in accordance with embodiments of the present disclosure.

FIG. 22 illustrates a cross-sectional schematic view of an example of a structure following the performance of a portion of the example method of FIG. 1, in accordance with embodiments of the present disclosure.

FIG. 23 illustrates a cross-sectional schematic view of an example of a structure following the performance of a portion of the example method of FIG. 1, in accordance with embodiments of the present disclosure.

FIG. 24 illustrates a cross-sectional schematic view of an example of a structure following the performance of a portion of the example method of FIG. 1, in accordance with embodiments of the present disclosure.

FIG. 25 illustrates a cross-sectional schematic view of an example of a structure following the performance of a portion of the example method of FIG. 1, in accordance with embodiments of the present disclosure.

FIG. 26 illustrates a cross-sectional schematic view of an example of a structure following the performance of a portion of the example method of FIG. 1, in accordance with embodiments of the present disclosure.

FIG. 27 illustrates a cross-sectional schematic view of an example of a structure following the performance of a portion of the example method of FIG. 1, in accordance with embodiments of the present disclosure.

FIG. 28 illustrates a cross-sectional schematic view of an example of a structure embodiments of the present disclosure.

FIG. 30 illustrates a cross-sectional schematic view of an example of a structure following the performance of a portion of the example method of FIG. 1, in accordance with embodiments of the present disclosure.

FIG. 31 illustrates a cross-sectional schematic view of an example of a structure following the performance of a portion of the example method of FIG. 1, in accordance with embodiments of the present disclosure.

FIG. 32 illustrates a cross-sectional schematic view of an example of a structure following the performance of a portion of the example method of FIG. 1, in accordance with embodiments of the present disclosure.

DETAILED DESCRIPTION

Figure 1:
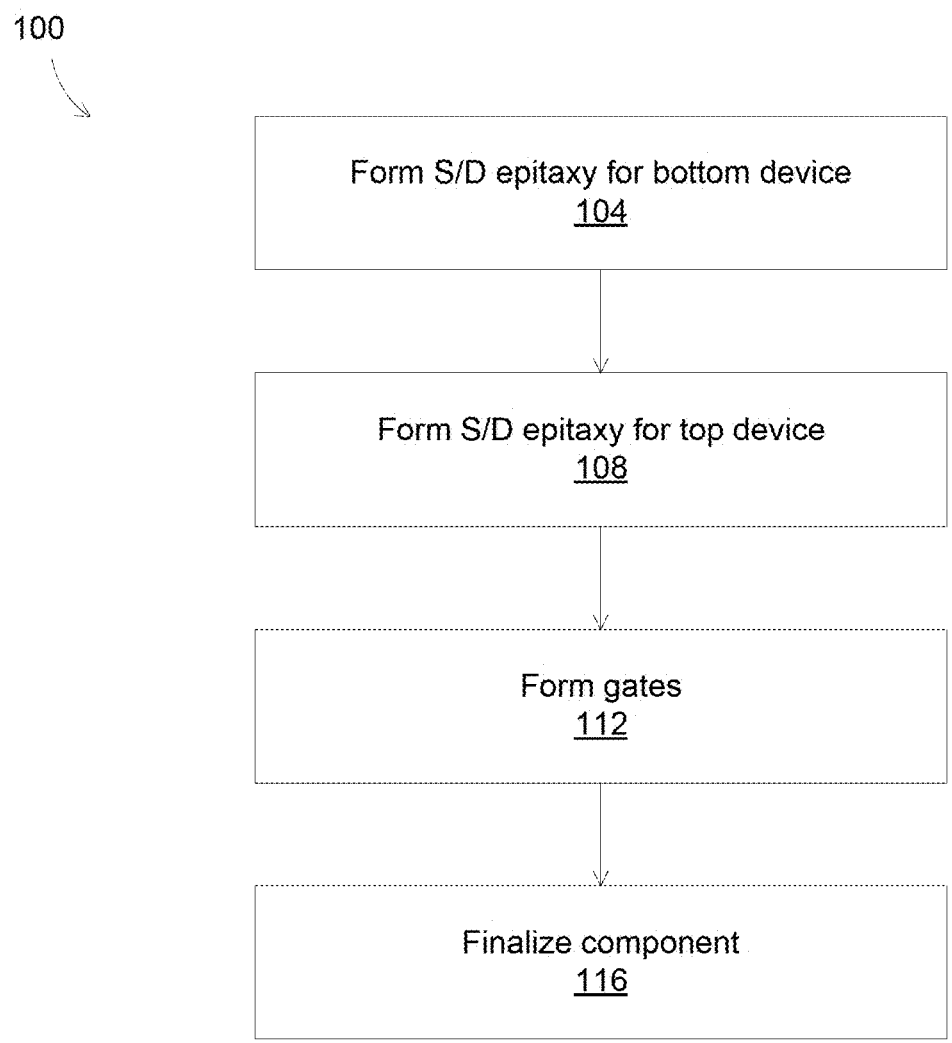
FIG. 1 illustrates a flowchart of an example method for forming a stacked transistor, in accordance with embodiments of the present disclosure.

Aspects of the present disclosure relate generally to the electrical, electronic, and computer fields. In particular, the present disclosure relates to semiconductor devices having stacked transistors. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, in general, a field-effect transistor (FET), sometimes called a unipolar transistor, uses either electrons (in an n-channel FET, also referred to as an nFET) or holes (in a p-channel FET, also referred to as a pFET) for conduction. The four terminals of the FET are referred to as the source, gate, drain, and body, which may also be referred to as the substrate. In a FET, the drain-to-source current flows via a conducting channel that connects the source region to the drain region. The conductivity is varied by the electric field that is produced when a voltage is applied between the gate and source terminals. Accordingly, the current flowing between the drain and source is controlled by the voltage applied between the gate and source.

Planar transistors are often used to fabricate integrated circuit logic devices. In a planar transistor, a source electrode and a drain electrode are laterally separated by a channel region. Overlying the channel region is a gate electrode that is typically separated from the channel region by a gate oxide. Planar transistors, although used and useful in many integrated circuit logic applications, are area intensive and consume a large amount of substrate area per transistor. In addition, with integrated circuit geometries decreasing into sub-micron ranges, planar transistors have various disadvantages.

One strategy for improving the integration density of FETs in integrated circuits is to produce integrated circuits including multiple stacked layers of transistors. Relative to transistors produced from a single semiconductor layer, a stacked structure makes it possible to increase the integration density of the transistors in the integrated circuit.

Current stacked FETs may suffer from various problems and disadvantages. For example, current stacked FET technologies may suffer from direct shorts. Additionally, current stacked FET technologies may create an over-burden in the top device region. Additionally, current stacked FET technologies may not enable a simple self-aligned integration, making fabrication difficult and unreliable.

Embodiments of the present disclosure may overcome these and other drawbacks of current stacked FET technologies by enabling realistic integration of a top and bottom device source-drain (S/D) epitaxy spacer to prevent direct shorts. Additionally, embodiments of the present disclosure enable vertical confinement of the bottom device S/D epitaxy to control over-burden in the top device region. Additionally, embodiments of the present disclosure enable a simple self-aligned integration of top and bottom device dual epitaxy.

More specifically, as described in further detail below, embodiments of the present disclosure provide a method and structure for forming stacked FET devices with an inner spacer epitaxy for a top and bottom device as well as a self-aligned S/D epitaxy spacer by a pinch-off mechanism. As explained in further detail below, the formation of the inner spacer epitaxy eliminates the need to form a third dielectric layer between the top device and the bottom device, simplifying fabrication. Additionally, portions of a middle dielectric layer are selectively removed such that the remaining portions help constrain the growth of the inner spacer epitaxy.

FIG. 1 depicts a flowchart of an example method 100 for forming monolithic stacked FETs, according to embodiments of the present disclosure. The method 100 begins with operation 104, wherein a source-drain (S/D) epitaxy for a bottom device of a monolithic stacked FET is formed. In accordance with some embodiments of the present disclosure, the performance of operation 104 further includes the performance of a number of sub-operations.

In accordance with at least one embodiment of the present disclosure, the performance of operation 104 includes nanosheet stack epitaxy growth. More specifically, the monolithic stacked FET formed by the performance of method 100 is formed on top of a nanosheet fin. Therefore, in accordance with some embodiments of the present disclosure, the performance of operation 104 begins with the growth of the nanosheet stack epitaxy.

Figure 2:
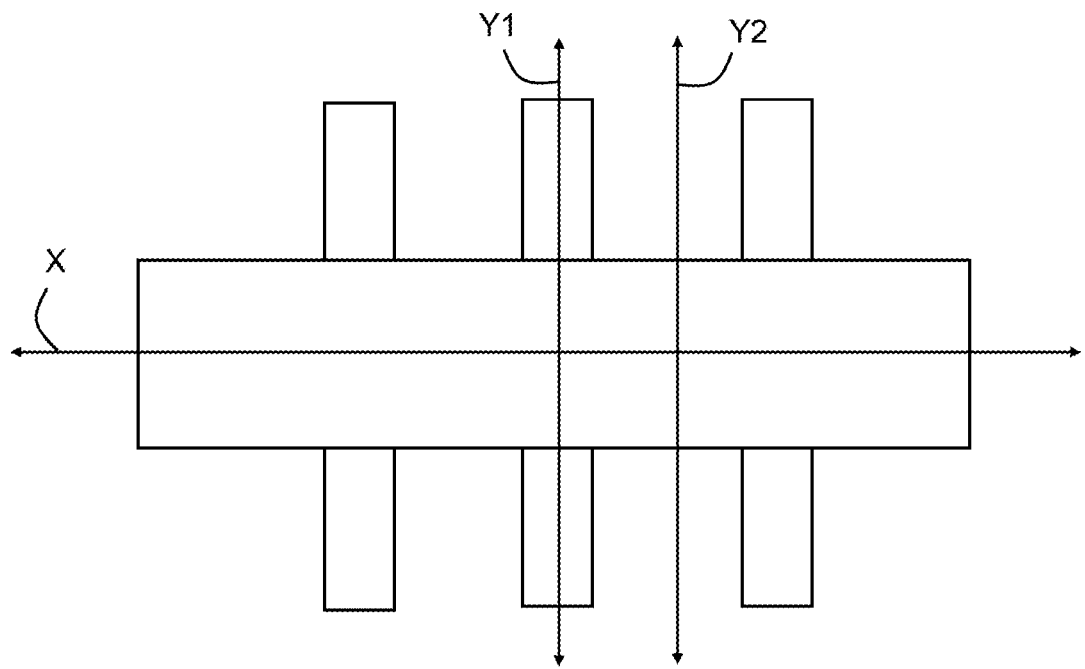
FIG. 2 depicts a schematic diagram illustrating a top plan view of an example device formed by performing a portion of the method 100, in accordance with embodiments of the present disclosure.

FIG. 2 depicts a schematic diagram illustrating a top plan view of an example device formed in accordance with embodiments of the method 100. The diagram is used to indicate where along the device the cross-sectional cuts are made to illustrate various features of the device. In particular, the line labeled X in FIG. 2 indicates a cross-sectional cut that is made along a length of the nanosheet fin, and therefore shows each of the gates formed thereon. The line labeled Y1 indicates a cross-sectional cut that is made perpendicular to the X cut and is cut into one of the gates. The line labeled Y2 indicates a cross-sectional cut that is made parallel to the Y1 cut and is cut between two gates.

FIG. 3 depicts an example structure 300 following the performance of the portion of operation 104 described above. The leftmost portion of FIG. 3 illustrates a view of the example structure 300 cut along the X cut shown in FIG. 2, the center portion of FIG. 3 illustrates a view of the example structure 300 cut along the Y1 cut shown in FIG. 2, and the rightmost portion of FIG. 3 illustrates a view the example structure 300 cut along the Y2 cut shown in FIG. 2. This arrangement of the views made along each of these cuts is maintained in FIG. 3 through FIG. 32.

The example structure 300 shown in FIG. 3 includes a substrate 302 and an isolation layer 304 formed on top of the substrate 302. The substrate 302 can be made of, for example, silicon. The isolation layer 304 can be made of, for example, silicon germanium 60% (SiGe60). The example structure 300 further includes a first set of silicon sheets 306 separated from one another and from the isolation layer 304 by a first set of separation layers 308. The separation layers 308 can be made of, for example, silicon germanium 25% (SiGe25). As described in further detail below, the first set of silicon sheets 306 and the first set of separation layers 308 will be used to form a bottom device of a monolithic stacked FET. Accordingly, the portion of the structure 300 including the first set of silicon sheets 306 and the first set of separation layers 308 may also be referred to herein as the bottom device region.

The example structure 300 further includes a further isolation layer 310 formed on top of the uppermost separation layer 308. The further isolation layer 310 is substantially similar to the isolation layer 304 and is made of the same material as the isolation layer 304. As described in further detail below, the further isolation layer 310 will be used to separate the bottom device from a top device of the monolithic stacked FET. Accordingly, the portion of the structure 300 including the further isolation layer 310 may also be referred to herein as the top-bottom separation region.

The example structure 300 further includes a second set of silicon sheets 312 formed above the further isolation layer 310. The silicon sheets 312 are separated from one another and from the further isolation layer 310 by a second set of separation layers 314. The separation layers 314 are substantially similar to the separation layers 308 and are made of the same material as the separation layers 308. As described in further detail below, the second set of silicon sheets 312 and the second set of separation layers 314 will be used to form the top device of the monolithic stacked FET. Accordingly, the portion of the structure 300 including the second set of silicon sheets 312 and the second set of separation layers 314 may also be referred to herein as the top device region.

As described in further detail below, the first set of separation layers 308 and the second set of separation layers 314 will be used in the formation of gate regions of the bottom device and the top device. Accordingly, the separation layers 308, 314 may also be referred to herein as portions of gate regions of the structure 300. As described in further detail below, each gate region is separated by a source-drain region.

In accordance with at least one embodiment of the present disclosure, each of the substrate 302, the isolation layer 304, the silicon sheets 306, the separation layers 308, the further isolation layer 310, the silicon sheets 312, and the separation layers 314 is formed by epitaxial growth processes. Together, the substrate 302, the isolation layer 304, the silicon sheets 306, the separation layers 308, the further isolation layer 310, the silicon sheets 312, and the separation layers 314 may be referred to as a nanosheet stack 315.

Notably, although the leftmost, center, and rightmost portions of FIG. 3 depict cross-sectional views of the structure 300 cut along different lines, following the performance of the above portion of the method 100, all three views of the structure 300 are the same.

In accordance with at least one embodiment of the present disclosure, the performance of operation 104 further includes depositing a hardmask on top of the structure, patterning the nanosheet stack, and then recessing the nanosheet stack. In accordance with at least one embodiment of the present disclosure, depositing the hardmask further includes depositing a layer of nitride material followed by depositing a layer of oxide material on the structure. In accordance with at least one such embodiment, depositing the hardmask further includes depositing a thin layer of oxide material on top of the structure prior to depositing the layer of nitride material.

Figure 4:
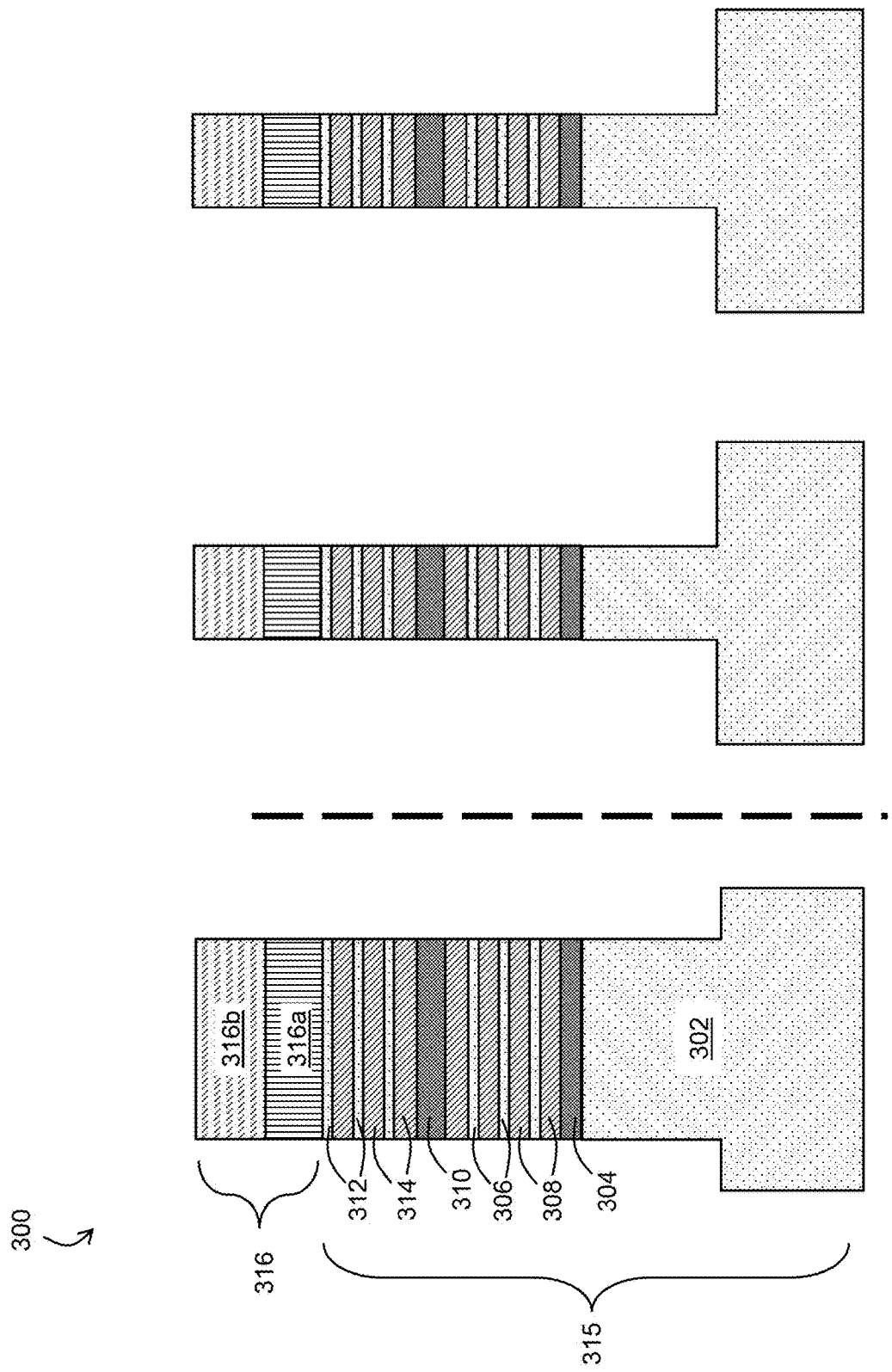
FIG. 4 illustrates a cross-sectional schematic view of an example of a structure following the performance of a portion of the example method of FIG. 1, in accordance with embodiments of the present disclosure.

FIG. 4 depicts the structure 300 following the performance of this portion of operation 104. As shown, the structure 300 includes a hardmask 316 formed on top of the uppermost silicon sheet 312 of the second set of silicon sheets. The hardmask 316 was patterned such that only those portions of the nanosheet stack 315 not covered by the hardmask 316 were removed, thereby recessing those portions of the nanosheet stack 315 that were exposed. In particular, the exposed portions of the nanosheet stack 315 were recessed to remove the separation layers 314, the silicon sheets 312, the further isolation layer 310, the separation layers 308, the silicon sheets 306, the isolation layer 304, and a portion of the thickness of the substrate 302 where those layers were not arranged directly beneath the hardmask 316.

In accordance with at least one embodiment of the present disclosure, the hardmask 316 includes a layer of nitride 316a formed on top of the uppermost silicon sheet 312, and a layer of oxide 316b formed on top of the layer of nitride 316a. In accordance with at least one embodiment of the present disclosure, the hardmask 316 may further include a thin layer of oxide (not shown) deposited on top of the uppermost silicon sheet 312 beneath the layer of nitride 316a.

In accordance with at least one embodiment of the present disclosure, the performance of operation 104 further includes forming shallow trench isolations (STIs) to replace the portions of the substrate that were removed during the performance of the stack recessing procedure described above. Accordingly, an uppermost surface of the STIs is substantially coplanar with the lowermost surface of the isolation layer. In accordance with at least one embodiment, the STIs are made of, for example, an oxide material. In accordance with at least one embodiment of the present disclosure, the performance of operation 104 further includes removal of the hardmask, for example, by performing a hardmask strip.

FIG. 5 depicts the structure 300 following the performance of this portion of operation 104. As shown, the structure 300 includes STIs 318 formed in contact with the substrate 302 to fill the portions of the substrate 302 that were removed during the stack recessing procedure described above. Accordingly, an uppermost surface of the STIs 318 is substantially coplanar with a lowermost surface of the isolation layer 304. Additionally, FIG. 5 illustrates the removal of the hardmask 316 (shown in FIG. 4) from the structure 300.

In accordance with at least one embodiment of the present disclosure, the performance of operation 104 further includes forming dummy gates on the structure. More specifically, in such embodiments, an oxide film is deposited on portions of the structure where dummy gates are to be formed. Accordingly, the oxide film covers exposed surfaces of the STIs as well as exposed surfaces of the isolation layers, the silicon sheets, and the separation layers that make up the nanosheet stack. In such embodiments, following the deposition of the oxide film, a dummy gate material is deposited on top of the oxide film. The dummy gate material can be, for example, a polysilicon material.

FIG. 6 depicts the structure 300 following the performance of this portion of the method 100. As shown, the structure 300 includes an oxide film 320 formed in contact with the exposed surfaces of the isolation layer 304, the silicon sheets 306, the separation layers 308, the further isolation layer 310, the silicon sheets 312, the separation layers 314, and the STIs 318. The structure 300 further includes dummy gate material 322 formed in contact with the oxide film 320.

Notably, following the performance of the above portion of the method 100, the leftmost and center views of the structure 300 shown in FIG. 6 are the same, because the oxide film and dummy gate material have been deposited over the areas illustrated by cuts X and Y1 (shown in FIG. 2). In contrast, the rightmost view of the structure 300 shown in FIG. 6 shows an area of the structure 300 on which the oxide film and dummy gate material were not deposited, because the cut Y2 (shown in FIG. 2) depicts an area of the structure 300 between gates.

In accordance with at least one embodiment of the present disclosure, the performance of operation 104 further includes depositing a second hardmask on top of the structure, patterning the dummy gates, and then etching the dummy gate material to form the dummy gates. In accordance with at least one embodiment of the present disclosure, like the hardmask described above, depositing the second hardmask further includes depositing a layer of nitride material followed by depositing a layer of oxide material on the structure. In accordance with at least one such embodiment, depositing the second hardmask further includes depositing a thin layer of oxide material on top of the structure prior to depositing the layer of nitride material. In accordance with at least one such embodiment, the thin layer of oxide material can be made of, for example ILOx.

Figure 7:
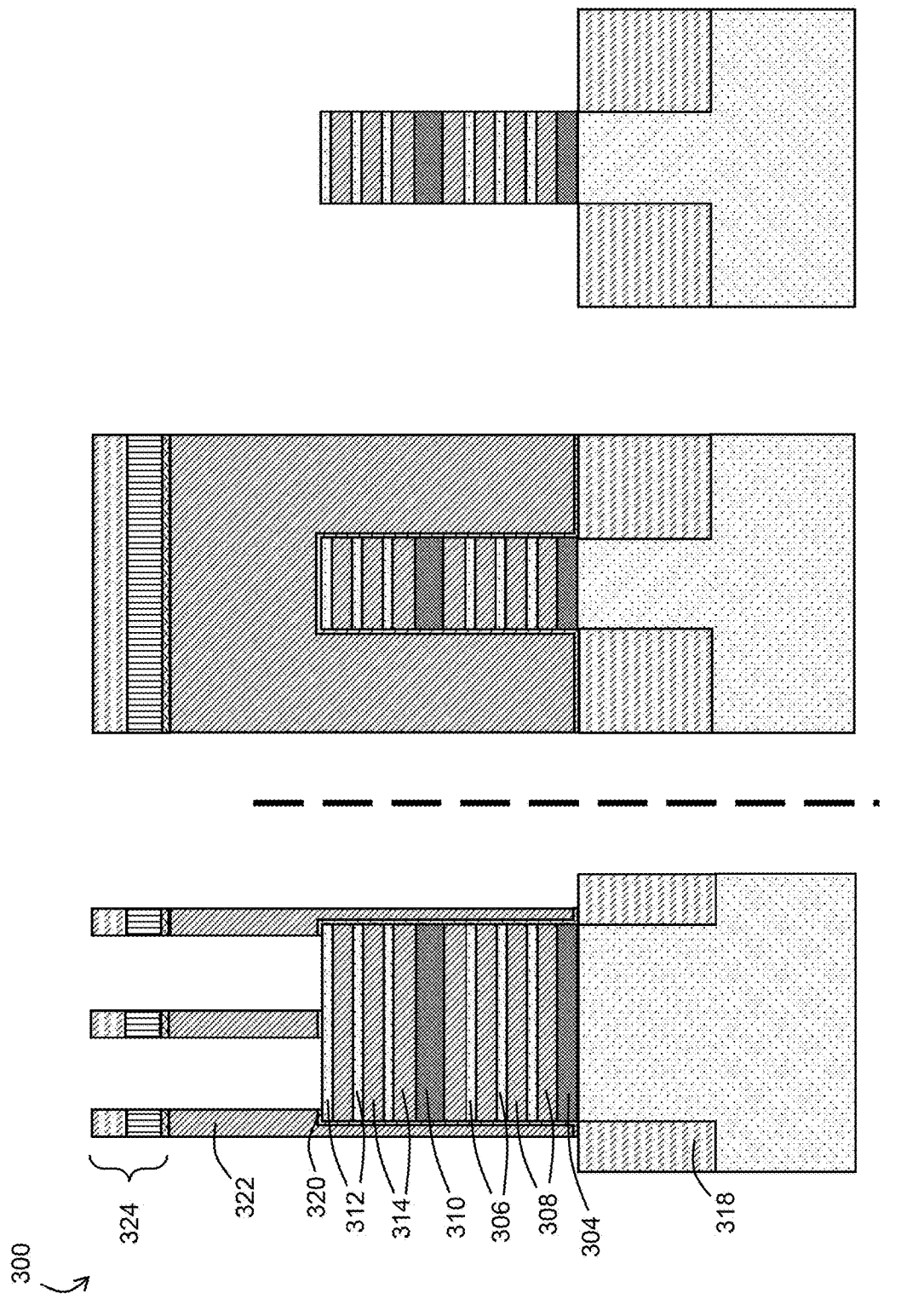
FIG. 7 illustrates a cross-sectional schematic view of an example of a structure embodiments of the present disclosure.

FIG. 7 depicts the structure 300 following the performance of this portion of operation 104. As shown, the structure 300 includes a second hardmask 324 formed on top of the dummy gate material 322. The second hardmask 324 was patterned such that only those portions of the dummy gate material 322 and oxide film 320 not covered by the second hardmask 324 were removed. In other words, those portions of the dummy gate material 322 and oxide film 320 that were not arranged directly underneath the second hardmask 324 were removed. Notably, the etching of the exposed portions of dummy gate material 322 and oxide film 320 does not remove any substantial portion of the STIs 318 or the uppermost silicon sheet 312 in the top device region.

Notably, following the performance of the above portion of the method 100, the leftmost, center, and rightmost views of the structure 300 have become clearly distinguishable from one another. In particular, the leftmost view of the structure shows the multiple distinct gate structures visible in the view illustrated by cut X (shown in FIG. 2). The center view of the structure shows the single gate structure through which cut Y1 (shown in FIG. 2) is made. The rightmost view of the structure shows no gate structures because the Y2 (shown in FIG. 2) cut is made between gates.

In accordance with at least one embodiment of the present disclosure, the performance of operation 104 further includes selectively removing the isolation layer and the further isolation layer from the nanosheet stack. The removal can be accomplished, for example, by selective etching of a particular material. For embodiments wherein the isolation layer and further isolation layer are made of SiGe60, a selective etch can be performed which removes only high Ge percentage materials. No other materials in the structure are removed by the selective removal process. In particular, separation layers, made of SiGe25 are unaffected by the selective etch. Accordingly, in such embodiments, the etch is selective to materials having a percentage of Ge that is, for example, greater than 25%.

Figure 8:
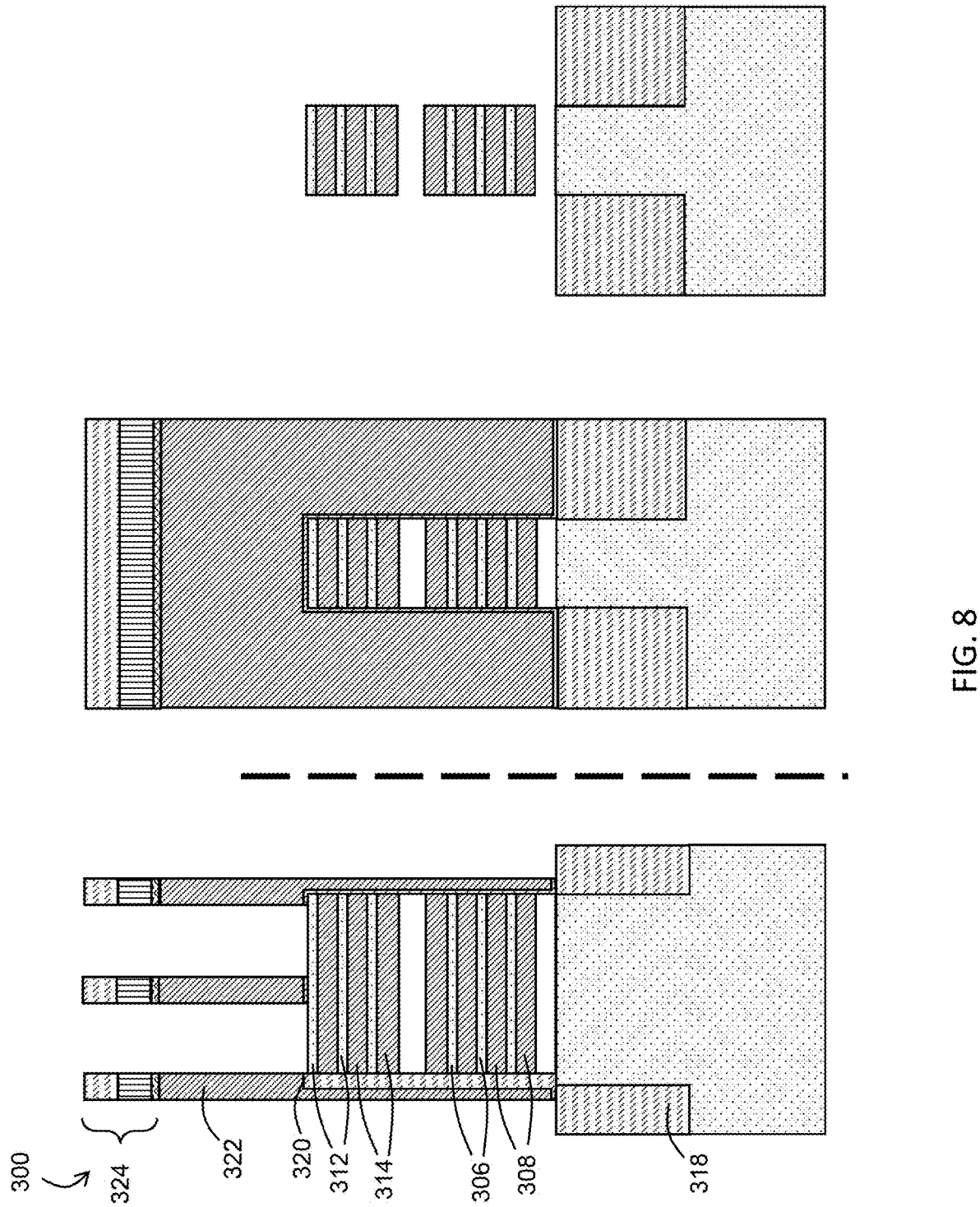
FIG. 8 illustrates a cross-sectional schematic view of an example of a structure following the performance of a portion of the example method of FIG. 1, in accordance with embodiments of the present disclosure.

FIG. 8 depicts the structure 300 following the performance of this portion of operation 104. As shown, the isolation layer 304 and further isolation layer 310 (shown in FIG. 6) have been selectively removed. As a result, two openings are formed in the structure 300.

In accordance with at least one embodiment of the present disclosure, the performance of operation 104 further includes conformal deposition of a low-k dielectric material on the structure 300. Because it is conformally deposited, the low-k dielectric material adheres to, and thereby covers, exposed surfaces of the dummy gates, the second hardmask, the STIs, and the uppermost surface of the top silicon sheet that was previously exposed when the dummy gates and oxide film were selectively etched. Additionally, conformal deposition also causes the low-k dielectric material to fill the openings in the structure formed by the removal of the isolation layer and further isolation layer. Accordingly, as described in further detail below, the conformal deposition of the low-k dielectric material on the structure forms gate spacers, forms a bottom dielectric isolation layer for the bottom device of the monolithic stacked FET, forms a top dielectric isolation layer for the top device, and forms a horizontal spacer that will separate the top (n-portion) device from the bottom (p-portion) device. These four results are all achieved by the performance of this portion of operation 104.

FIG. 9 shows the structure 300 following the performance of this portion of operation 104. As shown, a low-k dielectric material 326 has been conformally deposited over the structure 300. Accordingly, exposed surfaces of the STIs 318, the second hardmask 324, the dummy gate material 322, and the uppermost silicon sheet 312 in the top device region are covered by the low-k dielectric material 326. Additionally, the low-k dielectric material 326 fills the openings created by the removal of the isolation layer 304 (shown in FIG. 6) and the further isolation layer 310 (shown in FIG. 6). Therefore, surfaces of the substrate 302 and the lowermost separation layer 308 in the bottom device region that were exposed by the removal of the isolation layer 304 and surfaces of the uppermost separation layer 308 in the bottom device region and the lowermost separation layer 314 in the top device region that were exposed by the removal of the further isolation layer 310 are covered by the low-k dielectric material 326.

In areas of the structure between gates, such as that illustrated in the rightmost view of FIG. 9, where no dummy gate material 322 was applied and, therefore, no oxide film 320 or second hardmask 324 was applied, the low-k dielectric material 326 is in direct contact with the exposed surfaces of the silicon sheets 306, the separation layers 308, the silicon sheets 312, and the separation layers 314.

In the portions of the structure 300 shown in the leftmost and center views of FIG. 9, where the low-k dielectric material 326 conformally filled the openings left by the removal of the isolation layer and further isolation layer, the low-k dielectric material 326 conformally adheres to the exposed surfaces of the oxide film 320. In contrast, in the portion of the structure 300 shown in the rightmost view of FIG. 9, where there was no oxide film 320, the low-k dielectric material 326 conformally adheres to the exposed surfaces of the silicon sheets 306, 312 and separation layers 308, 314 and forms an indentation 328 between the lowermost separation layer 314 in the top device region and the uppermost silicon sheet 306 in the bottom device region where the low-k dielectric material 326 meets with itself.

In accordance with at least one embodiment of the present disclosure, the performance of operation 104 further includes etching back the low-k dielectric material. In particular, the low-k dielectric material is etched back to expose the oxide layer of the second hardmask and the uppermost surface of the uppermost silicon sheet in the top device region. Low-k dielectric material remains on the uppermost surface of the uppermost silicon sheet, however, where the low-k dielectric material is in contact with the vertical surfaces of the dummy gate material. The low-k dielectric material is also etched back from the horizontal uppermost surface of the STIs, but low-k dielectric material remains on the uppermost surface of the STIs where it is in contact with the vertical surfaces of the dummy gate material.

Figure 10:
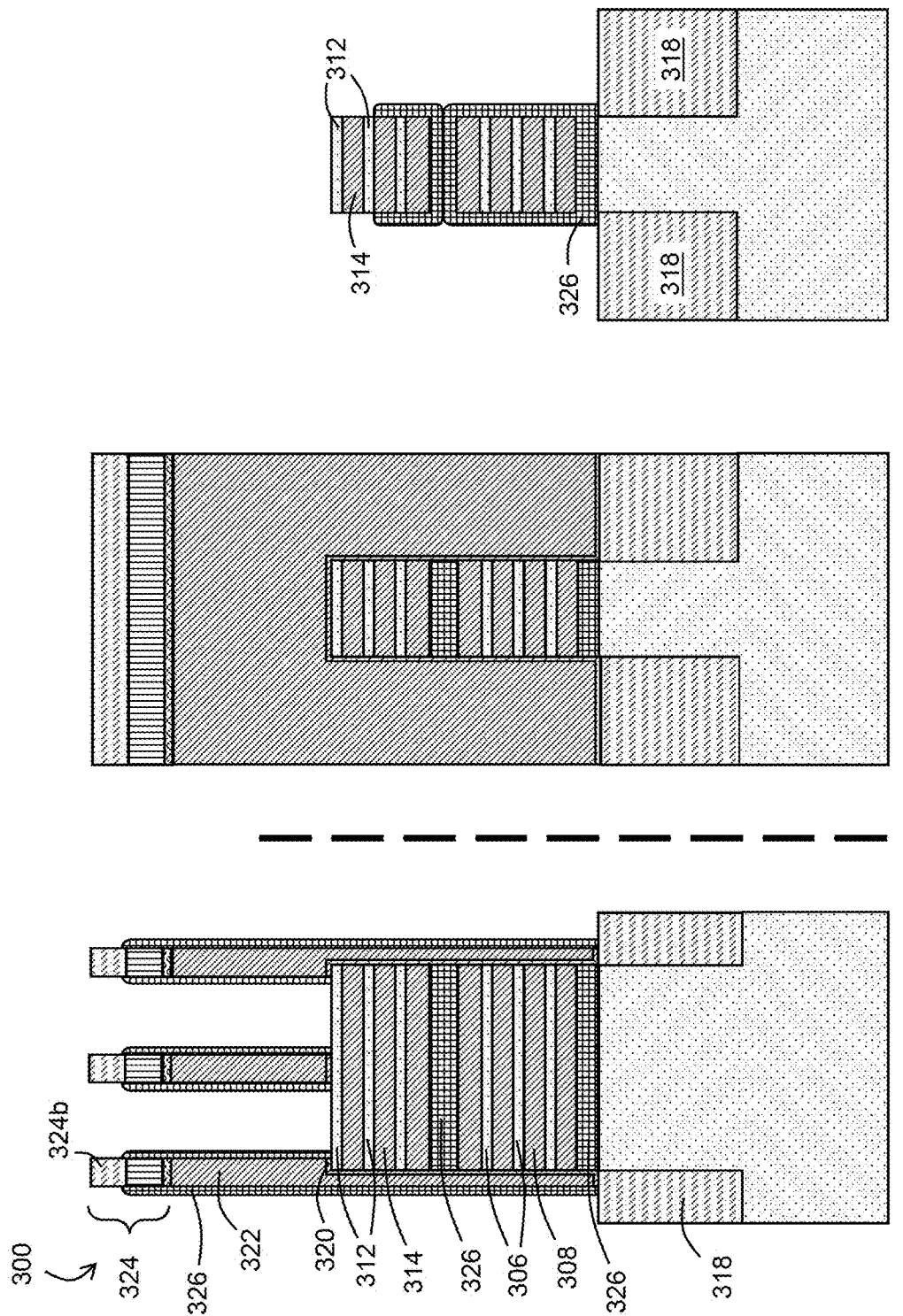
FIG. 10 illustrates a cross-sectional schematic view of an example of a structure following the performance of a portion of the example method of FIG. 1, in accordance with embodiments of the present disclosure.

FIG. 10 shows the structure 300 following the performance of this portion of operation 104. As shown in the leftmost and center views of the structure 300, the low-k dielectric material 326 has been etched back such that it is removed from the layer of oxide 324b of the second hardmask 324. In other words, the layer of oxide 324b of the second hardmask 324 has been exposed.

Additionally, as shown in the leftmost view of the structure 300, the low-k dielectric material 326 has been etched back such that it is removed from the uppermost surfaces of the STIs 318, except that the low-k dielectric material 326 remains on the uppermost surfaces of the STIs 318 where the low-k dielectric material 326 is in contact with the dummy gate material 322 or oxide film 320. Additionally, in the rightmost view of the structure 300, low-k dielectric material 326 remains on the uppermost surfaces of the STIs 318 where it is in contact with itself due to its location in the opening previously formed by the removal of the isolation layer.

Similarly, as shown in the leftmost view of the structure 300, the low-k dielectric material 326 has been etched back such that it is removed from the uppermost surface of the uppermost silicon sheet 312 in the top device region, except that the low-k dielectric material 326 remains on the uppermost surface of the uppermost silicon sheet 312 in the top device region where the low-k dielectric material 326 is in contact with the dummy gate material 322 or oxide film 320.

As shown in the rightmost view of the structure 300, the low-k dielectric material 326 has further been etched back in areas between gates to expose the top two silicon sheets 312 and the uppermost separation layer 314 in the top device region. In alternative embodiments, a greater or lesser amount of the low-k dielectric material 326 can be etched back to expose more or less of the nanosheet stack in the top device region.

In accordance with at least one embodiment of the present disclosure, the performance of operation 104 further includes selectively removing the silicon sheets and separation layers in the top device region in the areas between the gates. No other materials are affected during this removal. Additionally, the portions of the silicon sheets and the portions of the separation layers in the top device region that are arranged directly beneath dummy gate material or conformal low-k dielectric material are not affected during this removal.

In accordance with at least one embodiment of the present disclosure, the performance of operation 104 further includes conformally depositing a nitride liner on the structure following the selective removal of the silicon sheets and the separation layers in the top device region in the areas between the gates. The nitride liner will isolate and protect the remaining portions of the silicon sheets and separation layers in the top device region during subsequent fabrication processes.

Figure 11:
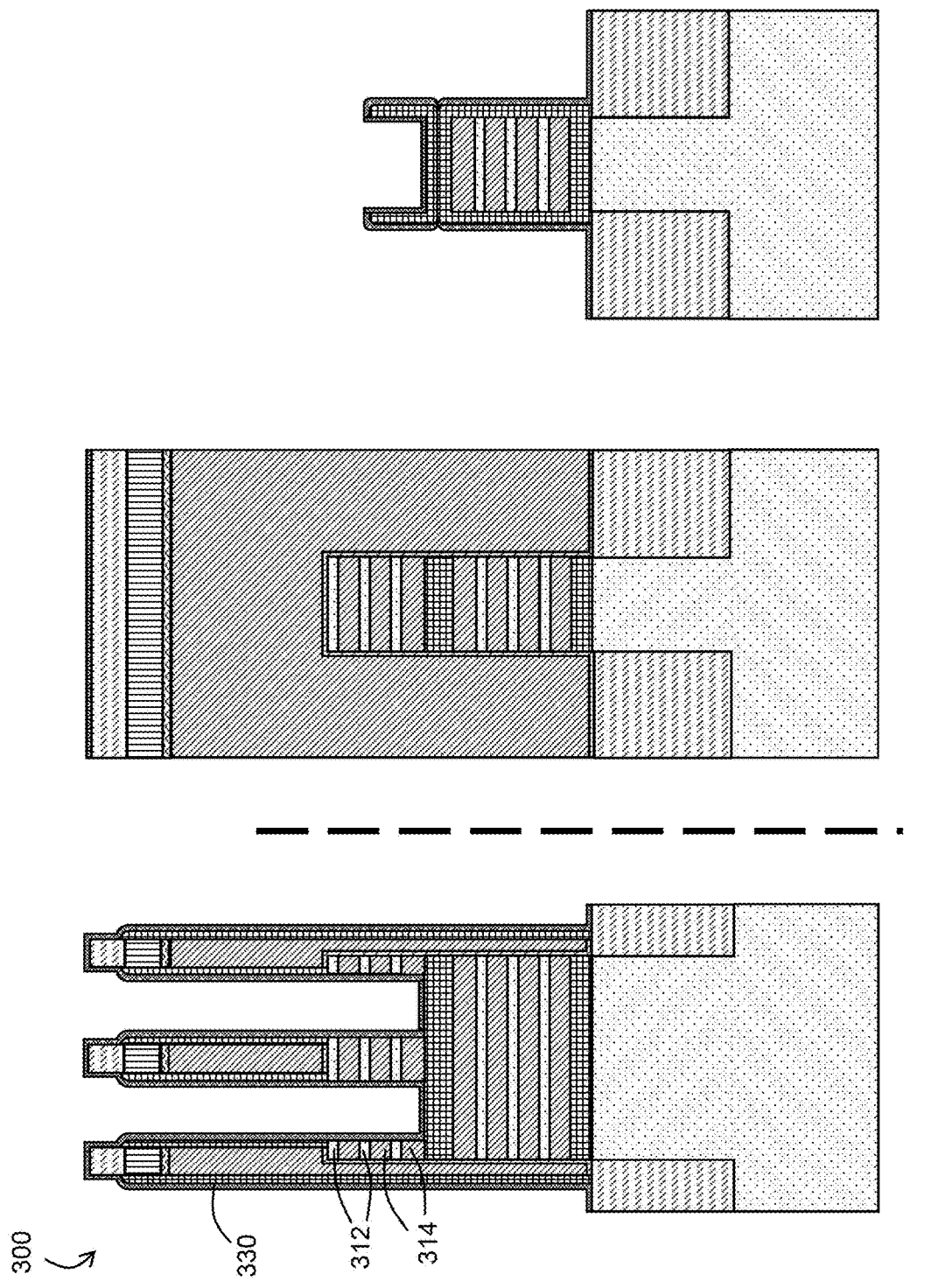
FIG. 11 illustrates a cross-sectional schematic view of an example of a structure following the performance of a portion of the example method of FIG. 1, in accordance with embodiments of the present disclosure.

FIG. 11 depicts the structure 300 following the performance of this portion of the method 100. As shown, the structure 300 includes a nitride liner 330 that has been conformally deposited on the structure 300 following the selective removal of the portions of silicon sheets 312 and the portions of the separation layers 314 in the top device region between gates. Because the rightmost view of the structure 300 depicts a portion of the structure 300 between gates, the rightmost view no longer includes silicon sheets 312 or separation layers 314 in the top device region.

In accordance with at least one embodiment of the present disclosure, the performance of operation 104 further includes performing a top-bottom device etch followed by a fin recess of the bottom device. In other words, in such embodiments, the nitride liner is selectively etched from horizontal surfaces of the structure. Notably, this selective removal of the nitride liner from horizontal surfaces results in the removal of the nitride liner from a small area adjacent to the second hardmask at the top of each gate.

Subsequently, the low-k dielectric material is selectively etched to remove those portions between the gates that form the horizontal spacer that were exposed by the removal of the horizontal portions of the nitride liner. Those portions of low-k dielectric material that form the horizontal spacer in the gates are not exposed by the removal of the horizontal portions of the nitride liner. Notably, this selective removal of the low-k dielectric material from the horizontal spacer also results in the removal of low-k dielectric material that was exposed by the removal of the nitride liner from the small area adjacent to the second hardmask at the top of each gate.

Subsequently, the silicon sheets and separation layers in the bottom device are selectively etched to remove those portions that were exposed by the selective removal of the horizontal spacer between the gates.

FIG. 12 shows the structure 300 following the performance of this portion of operation 104. The horizontal portions of the nitride liner 330 have been removed from the structure 300. Accordingly, the nitride liner 330 has been removed from the uppermost surfaces of the low-k dielectric material 326 between gates (in the source-drain regions) and on top of the STIs 318 except for where the nitride liner 330 is in contact with remaining vertical portions of low-k dielectric material 326 or separation layers 314.

As shown in the leftmost and rightmost views of the structure 300 in FIG. 12, in those areas where the nitride liner 330 has been removed from horizontal surfaces, the exposed low-k dielectric material 326 has been etched to remove the low-k dielectric material 326 that forms the horizontal spacer between the bottom device region and the top device region between the gates. As shown in the leftmost view of the structure 300, this removal of low-k dielectric material 326 also results in the removal of low-k dielectric material 326 that was exposed adjacent to the second hardmask 324 on top of the gates.

Following this selective removal of low-k dielectric material 326, the exposed areas of the silicon sheets 306 and separation layers 308 of the bottom device are removed down to the low-k dielectric material 326 that forms the bottom dielectric isolation layer for the bottom device. As shown in the leftmost and center views, the silicon sheets 306 and separation layers 308 of the bottom device remain where they are arranged beneath the remaining nitride liner 330, low-k dielectric material 326, dummy gate material 322, and silicon sheets 312 and separation layers 314 of the top device.

As shown in FIG. 12, the portions of the low-k dielectric material 326 are selectively removed following the selective removal of the portions of silicon sheets 312 and separation layers 314 such that remaining low-k dielectric material 326 in the horizontal spacer extends farther into the source-drain regions than the silicon sheets 312.

Also shown in FIG. 12, following the performance of this portion of operation 104, the separation layers 308, 314 are included in the gate regions 331 of the structure 300. As described in further detail below, the separation layers 308, 314 will each be recessed relative to their respective silicon sheets 306, 312. As a result, the silicon sheets 306, 312 will extend past the edges of the separation layers 308, 314. Recessing the separation layers 308, 314 in the gate regions 331 such that the silicon sheets 306, 312 extend past the edges of the separation layers 308, 314 in the gate regions 331 provides space for inner spacers which will be formed between each of the silicon sheets 306, 312 where the separation layers 308, 314 have been removed such that the separation layers 308, 314 of the gate regions 331 do not directly contact the subsequently formed source-drain epitaxies, but the silicon sheets 306, 312 do directly contact the subsequently formed source-drain epitaxies.

In accordance with at least one embodiment of the present disclosure, the performance of operation 104 further includes selectively recessing the silicon sheets of the bottom device relative to the separation layers. In such embodiments, the silicon sheets of the top device are unaffected, because they are protected by the remaining nitride liner. In some alternative embodiments, this portion is not included in the performance of operation 104.

Figure 13:
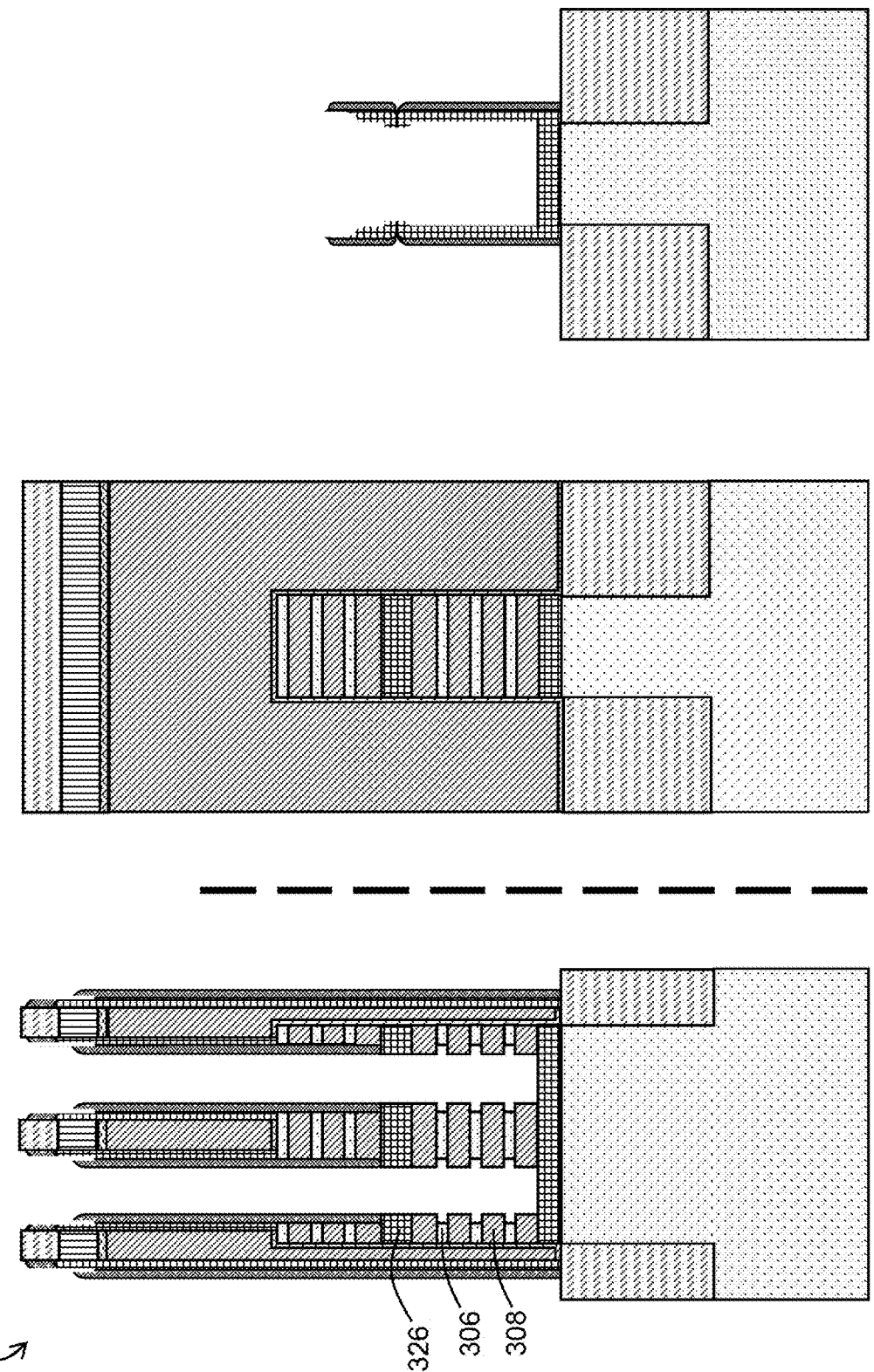
FIG. 13 illustrates a cross-sectional schematic view of an example of a structure following the performance of a portion of the example method of FIG. 1, in accordance with embodiments of the present disclosure.

FIG. 13 shows the structure 300 following the performance of this portion of operation 104. As shown, the silicon sheets 306 of the bottom device are recessed inwardly relative to the separation layers 308 of the bottom device where the silicon sheets 306 have been exposed by the selective removal of the low-k dielectric material 326 of the horizontal spacer. Accordingly, the recessed silicon sheets 306 are also recessed inwardly relative to the low-k dielectric material 326 of the horizontal spacer. In other words, the low-k dielectric material 326 of the horizontal spacer extends farther inwardly into the source-drain regions of the structure 300 than the recessed silicon sheets 306.

As noted above, the low-k dielectric material 326 of the horizontal spacer also extends farther inwardly into the source-drain regions of the structure 300 than the silicon sheets 312. Accordingly, the low-k dielectric material 326 of the horizontal spacer extends farther inwardly into the source-drain regions of the structure 300 than the silicon sheets 312 and the recessed silicon sheets 306.

In accordance with at least some embodiments of the present disclosure, the performance of operation 104 further includes recessing the separation layers of the bottom device relative to the silicon sheets of the bottom device. In the same manner as above, the separation layers of the top device are unaffected, because they are protected by the remaining nitride liner.

FIG. 14 shows the structure 300 following the performance of this portion of operation 104. As shown, the separation layers 308 of the bottom device are recessed inwardly relative to the silicon sheets 306 of the bottom device where the separation layers 308 have been exposed by the selective removal of the low-k dielectric material 326 of the horizontal spacer.

In accordance with at least some embodiments of the present disclosure, the performance of operation 104 further includes forming an inner spacer between the gates in the bottom device. Additionally, the inner spacer is formed such that material of the inner spacer fills the recessed portions of the separation layers of the bottom device. Accordingly, the inner spacer covers and isolates the separation layers of the bottom device. The inner spacer material can be, for example, a low-k nitride.

Figure 15:
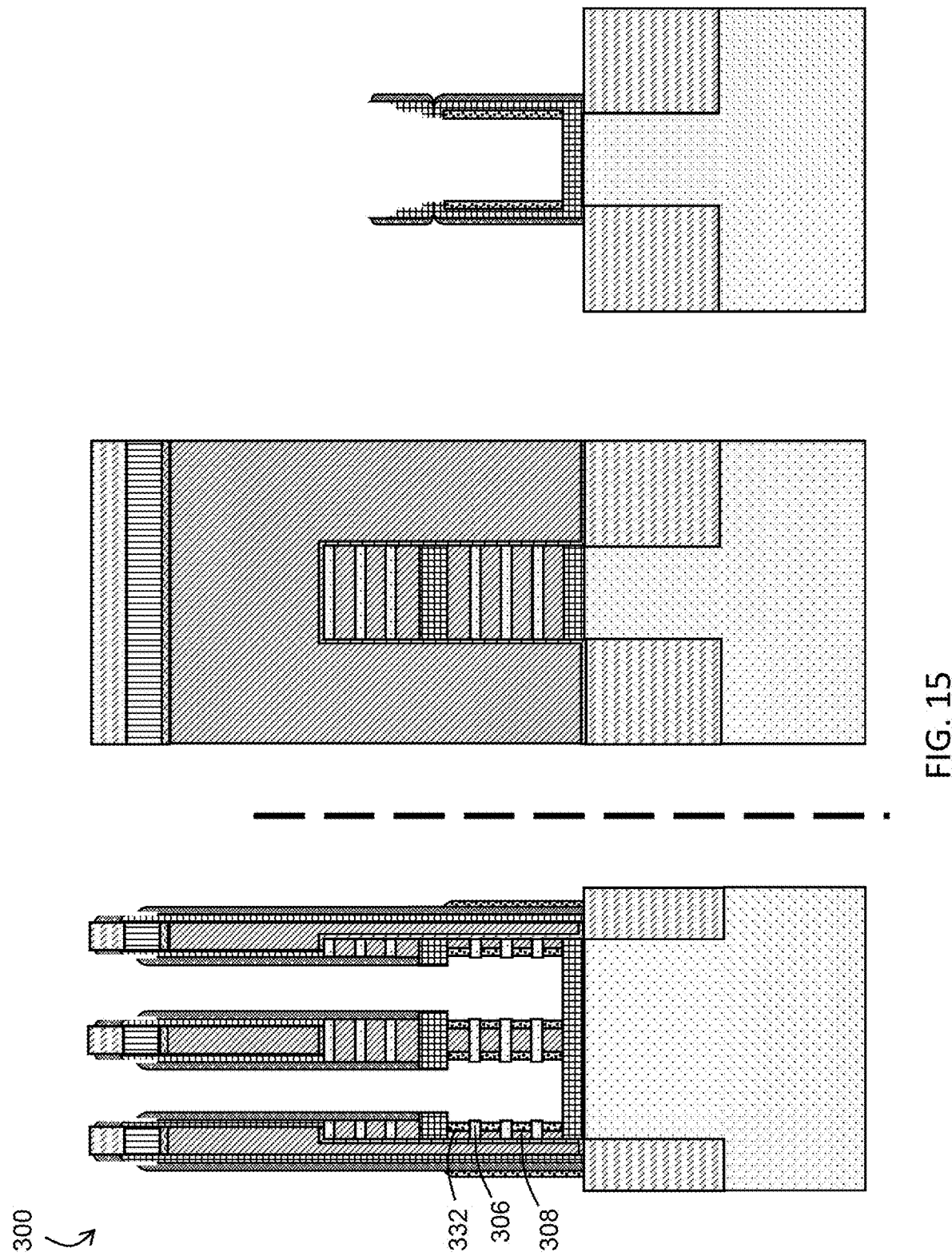
FIG. 15 illustrates a cross-sectional schematic view of an example of a structure following the performance of a portion of the example method of FIG. 1, in accordance with embodiments of the present disclosure.

FIG. 15 shows the structure 300 following the performance of this portion of operation 104. As shown in the leftmost and rightmost views, an inner spacer 332 has been formed between gates in the bottom device. Additionally, the inner spacer 332 is formed on the recessed portions of the separation layers 308 of the bottom device. Where it is formed on the separation layers 308, the inner spacer 332 is interrupted by the recessed silicon sheets 306 of the bottom device, which extend farther inwardly into the source-drain regions than the recessed separation layers 308.

In accordance with at least some embodiments of the present disclosure, the performance of operation 104 further includes forming a S/D epitaxy material between gates in the bottom device. In some embodiments, the bottom device is a pFET. In such embodiments, the S/D epitaxy material can be, for example, SiGeB.

Figure 16:
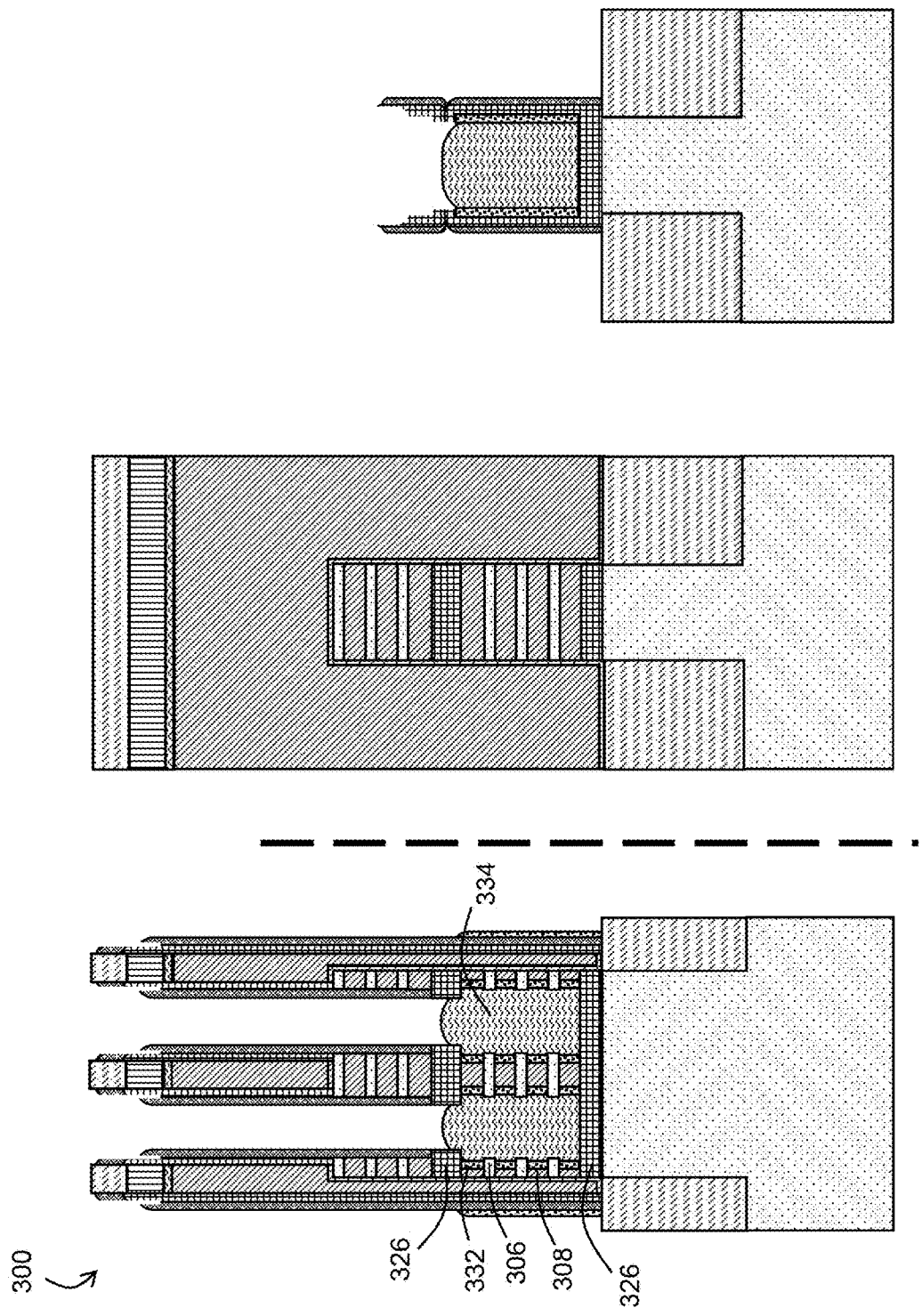
FIG. 16 illustrates a cross-sectional schematic view of an example of a structure following the performance of a portion of the example method of FIG. 1, in accordance with embodiments of the present disclosure.

FIG. 16 shows the structure 300 following the performance of this portion of operation 104. As shown, the structure 300 includes bottom device epitaxy material 334 formed between gates in contact with the inner spacer 332, the silicon sheets 306 of the bottom device, the low-k dielectric material 326 of the horizontal spacer, and the low-k dielectric material 326 of the bottom dielectric isolation layer of the bottom device. As shown in the leftmost view, the bottom device epitaxy material 334 is separated from the separation layers 308 by the inner spacer 332.

Following the performance of this portion of operation 104, the S/D epitaxy for the bottom device of the monolithic stacked FET is formed. Accordingly, following the performance of this portion, the performance of operation 104 is complete. Returning to FIG. 1, following the performance of operation 104, the method 100 proceeds with operation 108, wherein a S/D epitaxy for a top device of the monolithic stacked FET is formed. In accordance with some embodiments of the present disclosure, the performance of operation 108 further includes the performance of a number of sub-operations.

In accordance with at least one embodiment of the present disclosure, the performance of operation 108 includes selectively removing dielectric liners from the structure. In some embodiments, this includes the removal of remaining exposed portions of the nitride liner and the removal of remaining exposed portions of the inner spacer.

Figure 17:
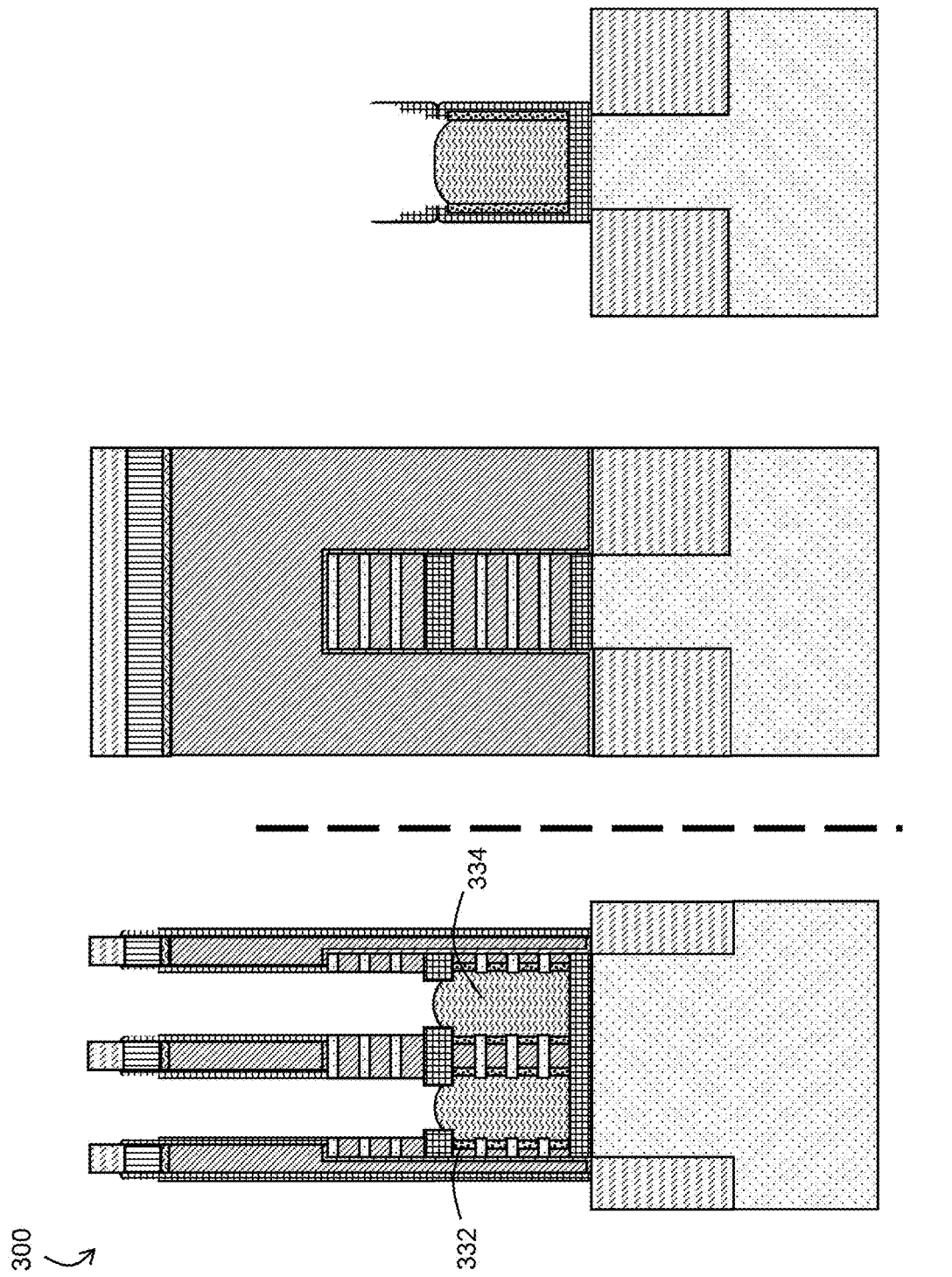
FIG. 17 illustrates a cross-sectional schematic view of an example of a structure following the performance of a portion of the example method of FIG. 1, in accordance with embodiments of the present disclosure.

FIG. 17 shows the structure 300 following the performance of this portion of operation 108. As shown, the remaining exposed portions of the nitride liner 330 (shown in FIG. 12) and inner spacer 332 (shown in FIG. 16) have been removed. The inner spacer 332 remains in the structure 300 where it was covered and isolated by the bottom device epitaxy material 334.

In accordance with at least one embodiment of the present disclosure, the performance of operation 108 further includes recessing the separation layers of the top device relative to the silicon sheets of the top device.

Figure 18:
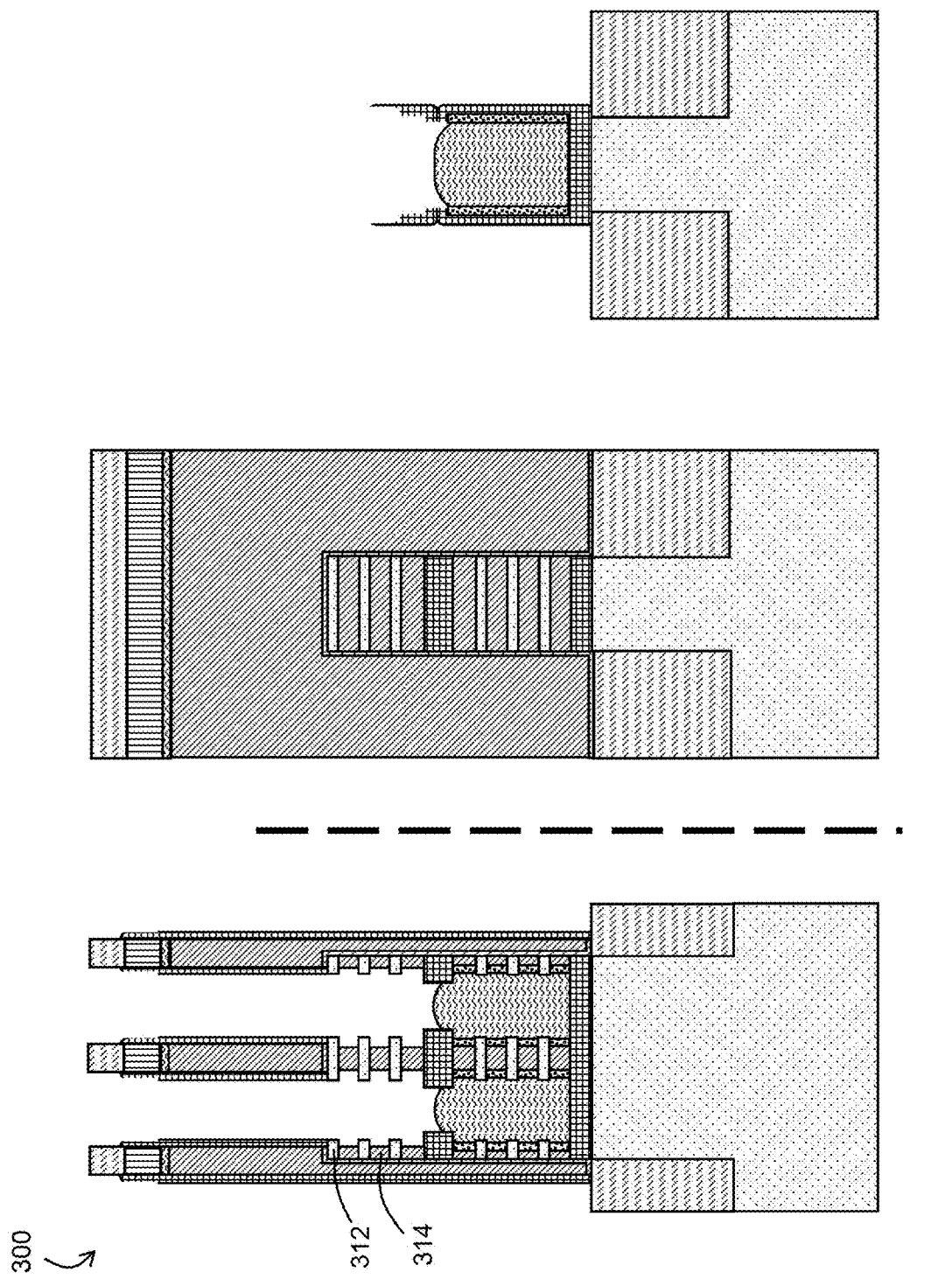
FIG. 18 illustrates a cross-sectional schematic view of an example of a structure following the performance of a portion of the example method of FIG. 1, in accordance with embodiments of the present disclosure.

FIG. 18 shows the structure 300 following the performance of this portion of operation 108. As shown, the separation layers 314 of the top device are recessed inwardly relative to the silicon sheets 312 of the top device.

In accordance with at least one embodiment of the present disclosure, the performance of operation 108 further includes forming a further inner spacer covering all exposed surfaces of the structure. In other words, the further inner spacer is continuous across the gates and across the source-drain regions of the structure. Thus, the further inner spacer is formed between gates in the top device. In particular, the further inner spacer is formed such that the material of the further inner spacer fills the recessed portions of the separation layers of the top device. In accordance with at least one embodiment of the present disclosure, the further inner spacer is made of the same material as the inner spacer, described above. In accordance with at least one embodiment of the present disclosure, the further inner spacer is made of a different material than the low-k dielectric material that forms the horizontal spacer.

Notably, the further inner spacer covers and isolates the separation layers of the top device. Additionally, the further inner spacer also covers and isolates the uppermost surface of the bottom device epitaxy material that is exposed between remaining portions of the low-k dielectric material of the horizontal spacer. Accordingly, the further inner spacer provides the isolation of the separation layers of the top device and also provides the isolation of the bottom device epitaxy material. In other words, the further inner spacer acts partially as a replacement for the low-k dielectric material that was previously removed from the horizontal spacer in order to enable the formation of the bottom device epitaxy material. Therefore, the further inner spacer also acts as a separation between the top device and the bottom device. Notably, the further inner spacer, which was applied as a single, continuous mass over the entire structure, and is therefore made of a single material, performs these multiple functions.

FIG. 19 shows the structure 300 following the performance of this portion of operation 108. As shown, the further inner spacer 336 covers all exposed surfaces of the structure 300. Therefore, the further inner spacer 336 covers and isolates the recessed portions of the separation layers 314 of the top device and also covers and isolates the exposed uppermost surface of the bottom device epitaxy material 334. Accordingly, following the performance of this portion of operation 108, the bottom device has been completed and isolated.

In accordance with at least one embodiment of the present disclosure, the performance of operation 108 further includes performing a conformal dielectric etch back to selectively remove portions of the further inner spacer. Importantly, the procedure is performed such that further inner spacer remains to maintain the coverage and isolation of the separation layers of the top device and to maintain the coverage and isolation of the bottom device epitaxy material.

Figure 20:
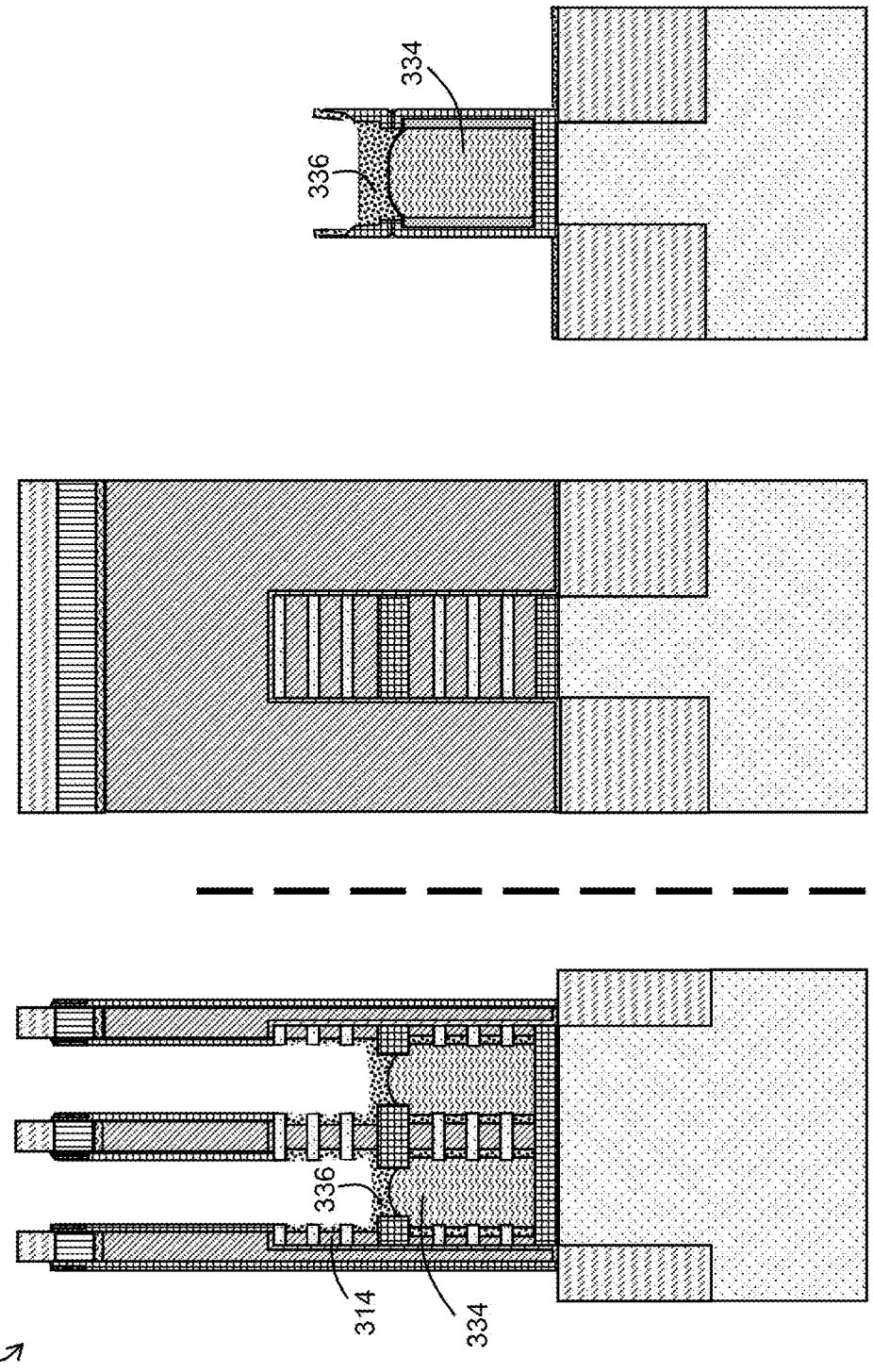
FIG. 20 illustrates a cross-sectional schematic view of an example of a structure following the performance of a portion of the example method of FIG. 1, in accordance with embodiments of the present disclosure.

FIG. 20 shows the structure 300 following the performance of this portion of operation 108. As shown, the further inner spacer 336 has been removed except to the extent that it remains to maintain the coverage and isolation of the separation layers 314 of the top device and to maintain the coverage and isolation of the bottom device epitaxy material 334.

Figure 21:
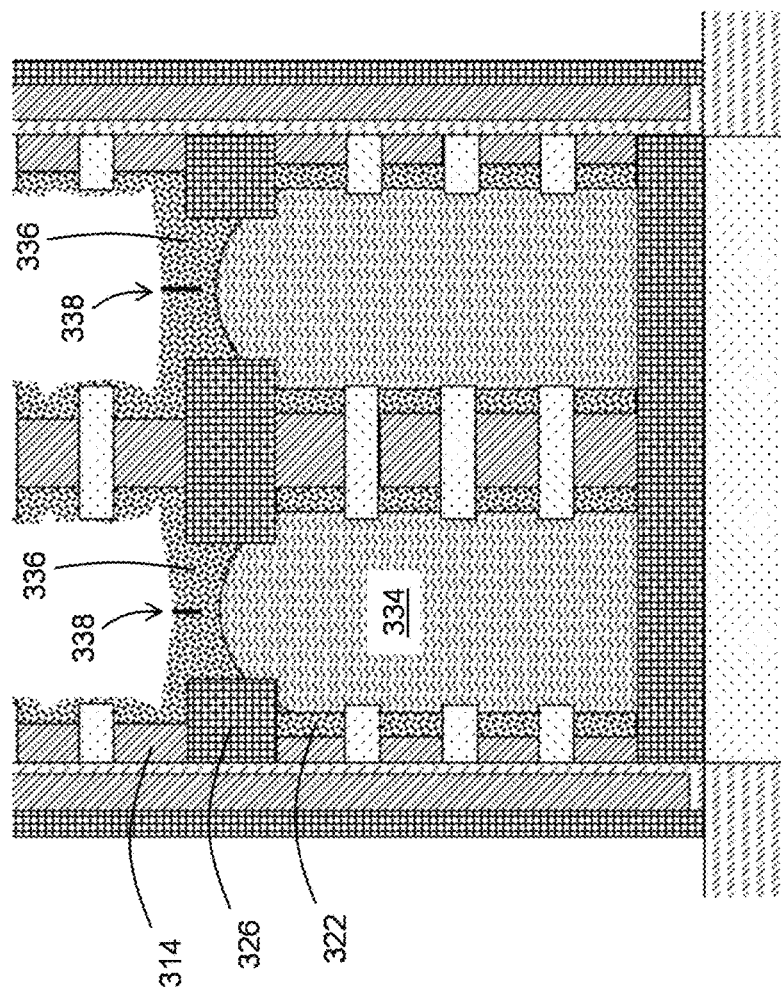
FIG. 21 illustrates a cross-sectional schematic view of an example of a structure embodiments of the present disclosure.

FIG. 21 shows a zoomed-in view of a portion of the leftmost view of the structure 300 shown in FIG. 20 to illustrate seams 338 that are necessarily formed by the performance of the preceding portions of the method 100. In other words, when a further inner spacer 336 is conformally deposited in the manner described above, such seams 338 are always formed. Accordingly, such seams 338 can indicate that the preceding portions of the method 100 have been performed.

Notably, the seams 338 are generated due to the presence of the low-k dielectric material 326 of the horizontal spacer which extends inwardly relative to the recessed separation layers 314 and the dummy gate material 322 thereby reducing the size of the opening to be filled by the inner spacer 336 above the bottom device epitaxy material 334. In particular, when the inner spacer 336 is formed, the material adheres to the surfaces of the low-k dielectric material 326 of the horizontal spacer in each gate region, and the seams 338 are formed where the material of the inner spacer 336 meets with itself. Additionally, the low-k dielectric material 326 of the horizontal spacer also helps confine the bottom device epitaxy material 334, thereby reducing chances of a short between top and bottom devices.

In accordance with at least one embodiment of the present disclosure, the performance of operation 108 further includes forming a S/D epitaxy material between gates in the top device. In some embodiments, the top device is an nFET. In such embodiments, the S/D epitaxy material can be, for example, SiP.

FIG. 22 shows the structure 300 following the performance of this portion of operation 108. As shown, the structure 300 includes top device epitaxy material 340 formed between gates in contact with the further inner spacer 336, the silicon sheets 312 of the top device, and the low-k dielectric material 326 that remains between the gates. As shown in the leftmost and rightmost views, the top device epitaxy material 340 is separated from the bottom device epitaxy material 334 by the further inner spacer 336.

Following the performance of this portion of operation 108, the S/D epitaxy for the top device of the monolithic stacked FET is formed. Accordingly, following the performance of this portion, the performance of operation 108 is complete. Returning to FIG. 1, following the performance of operation 108, the method 100 proceeds with operation 112, wherein gates are formed. In accordance with some embodiments of the present disclosure, the performance of operation 112 further includes the performance of a number of sub-operations.

In accordance with at least one embodiment of the present disclosure, the performance of operation 112 includes forming a contact etch stop layer (CESL) on the structure followed by depositing an inner layer dielectric (ILD) to fill remaining open space of the structure. In accordance with at least one embodiment of the present disclosure, the ILD is an oxide. Following the ILD fill, the structure is planarized to provide a level and planar top surface of the structure.

FIG. 23 shows the structure 300 following the performance of this portion of operation 112. As shown, the structure 300 includes a CESL 342 and an ILD 344. The CESL 342 has been applied such that it covers all exposed surfaces of the structure 300 prior to filling the structure 300 with ILD 344. Accordingly, the ILD 344 is separated from all other features of the structure 300 by the CESL 342.

Additionally, FIG. 23 illustrates that the structure 300 was subsequently planarized. In particular, the structure 300 was planarized down to the layer of nitride 324a of the second hardmask 324. In other words, the layer of oxide 324b (shown in FIG. 10) has been removed during planarization of the structure 300.

In accordance with at least one embodiment of the present disclosure, the performance of operation 112 further includes selectively removing the layer of nitride of the second hardmask.

FIG. 24 illustrates the structure 300 following the performance of this portion of operation 112. Notably, the second hardmask 324 (shown in FIG. 23) was previously removed except above the gates. Accordingly, the leftmost and center views of the structure 300, which show the gates, illustrate that the layer of nitride 324a (shown in FIG. 23) has been removed such that the dummy gate material 322 previously covered by the second hardmask 324 (shown in FIG. 10) has been exposed.

In accordance with at least one embodiment of the present disclosure, the performance of operation 112 further includes performing a channel release procedure. More specifically, the dummy gate material, the oxide film beneath the dummy gate material, and the remaining portions of the separation layers beneath the oxide film are selectively removed from the structure. As a result, a channel is opened for the formation of a permanent gate where each dummy gate had been acting as a placeholder for the gate during the performance of previous fabrication processes.

FIG. 25 illustrates the structure 300 following the performance of this portion of the operation 112. As shown, the previous removal of the layer of nitride 324a (shown in FIG. 23), which exposed the uppermost surfaces of the dummy gate material 322 (shown in FIG. 24), enabled the selective removal of the dummy gate material from the structure 300. Likewise, the removal of the dummy gate material enabled the selective removal of the oxide film 320 (shown in FIG. 10) that had previously been covered by the dummy gate material. Furthermore, the removal of the oxide film enabled the selective removal of the separation layers 308, 314 (shown in FIGS. 16 and 22) of the bottom and top devices, respectively, that had previously been covered by the oxide film. Notably, the selective removal of these portions of the structure 300 does not affect the silicon sheets 306, 312 of the bottom and top devices or the remaining low-k dielectric material 326.

In accordance with at least one embodiment of the present disclosure, the performance of operation 112 further includes depositing a high-k gate dielectric material on the structure, and subsequently depositing a first work function metal (WFM) on the structure. The high-k gate dielectric material separates the existing features of the structure from the subsequently formed first WFM. In accordance with at least one embodiment, depositing the high-k gate dielectric material can include forming a thin layer of low-k oxide such as, for example, ILOx on existing features of the structure followed by forming a thin layer of high-k material such as, for example, HfO2 on top of the thin layer of low-k oxide.

The first WFM that is deposited in the performance of this portion of operation 112 is the WFM for the bottom device of the monolithic stacked FET. Accordingly, in the example device, wherein the bottom device is a pFET, the first WFM is a p-type WFM. In accordance with at least one embodiment of the present disclosure, the p-type WFM can be, for example, TiN.

FIG. 26 illustrates the structure 300 following the performance of this portion of operation 112. As shown in the leftmost and center views, the channels formed by the selective removal of the dummy gate material, the oxide film, and the remaining portions of the separation layers are partially lined by the deposition of a high-k gate dielectric material 346. A first WFM 348 is subsequently formed on those portions of the structure 300 that were lined by the high-k gate dielectric material 346. As described in further detail below, the first WFM 348 forms the permanent gate in the area of the bottom device of the monolithic stacked FET.

In accordance with at least one embodiment of the present disclosure, the performance of operation 112 further includes depositing and recessing an organic planarization layer (OPL) on the structure followed by a removal of the first WFM from the area of the top device. As described in further detail below, the recessed OPL allows the first WFM to be etched below to enable subsequent deposition of a second WFM in the area of the top device. In particular, for the example structure wherein the top device is an nFET device, the p-type WFM that was formed for use in the bottom device is removed from the top device.

FIG. 27 illustrates the structure 300 following the performance of this portion of operation 112. As shown in the center view, an OPL 350 has been deposited on the structure 300 and recessed to enable removal of the first WFM 348 from the top device.

In accordance with at least one embodiment of the present disclosure, the performance of operation 112 further includes depositing materials to form a second WFM for the top device. This includes depositing the second WFM to cover the exposed surfaces of the silicon sheets of the top device as well as the high-k gate dielectric material that remains above the recessed first WFM. In the example device, wherein the top device is an nFET, forming the second WFM includes depositing an n-type WFM.

Additionally, depositing materials to form the second WFM includes subsequently applying a conductive material to fill voids between the second WFM in the channel. In accordance with at least one embodiment of the present disclosure, the conductive material can be, for example, TiN. The conductive material is prevented from contacting the silicon sheets of the top device by the second WFM. In the example device, wherein the second WFM is an n-type WFM, the conductive material is prevented from contacting the silicon sheets of the top device by the n-type WFM.

FIG. 28 illustrates the structure 300 following the performance of this portion of operation 112. As shown, a second WFM 352 has been applied to cover the silicon sheets 312 of the top device and to cover the high-k gate dielectric material 346 that remained above the recessed first WFM 348. Following the application of the second WFM 352, a conductive material 354 has been applied to fill voids between the second WFM 352. The silicon sheets 312 are isolated from contact with the conductive material 354 by the second WFM 352.

In accordance with at least one embodiment of the present disclosure, the performance of operation 112 further includes depositing a gate contact material to fill the remaining space in each of the channels, recessing the gate contact material and the conductive material within each of the channels, and then forming a cap in each channel to seal the channel and complete each gate. In accordance with at least one embodiment of the present disclosure, the gate contact material can be, for example, tungsten.

Figure 29:
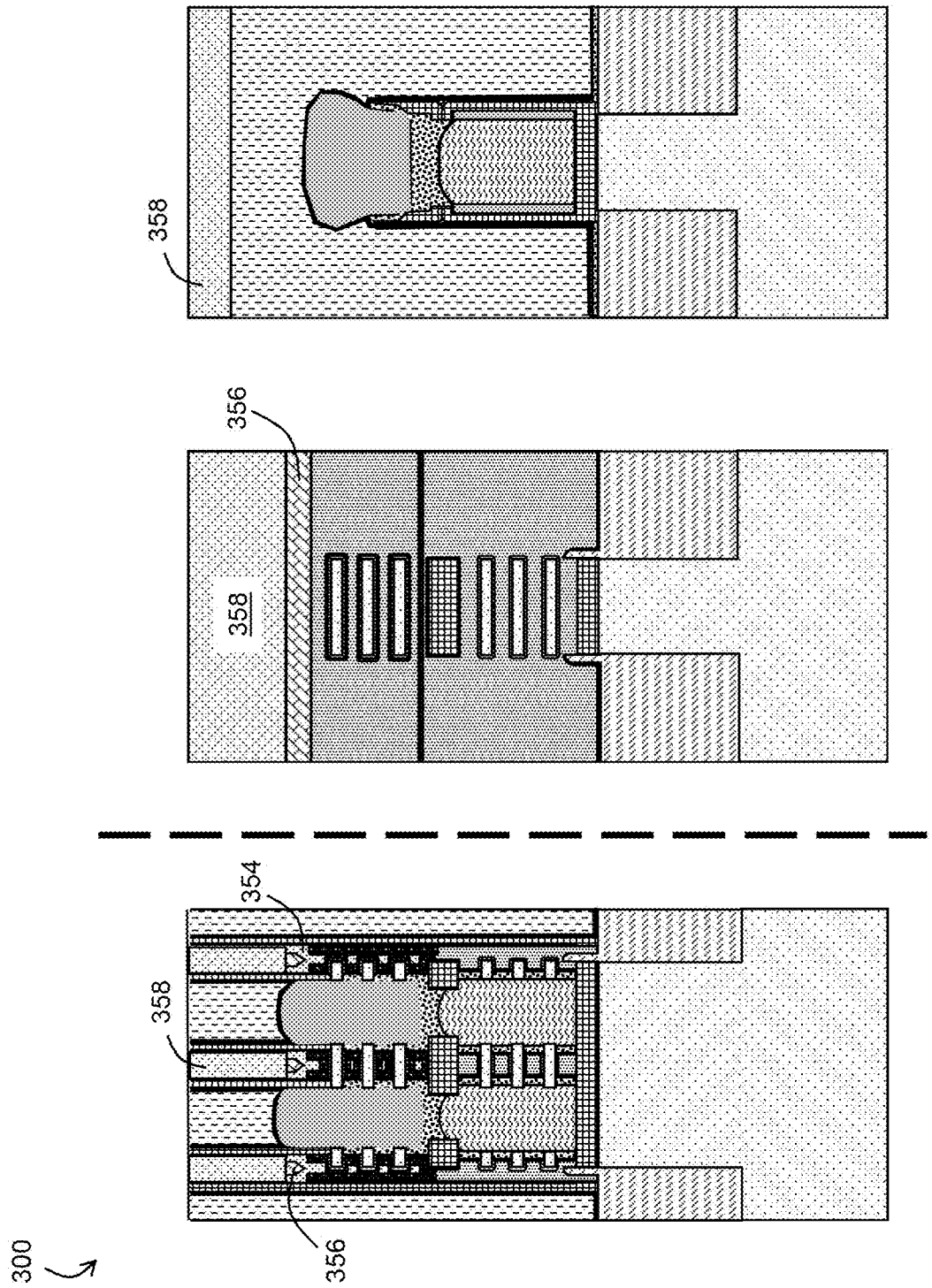
FIG. 29 illustrates a cross-sectional schematic view of an example of a structure following the performance of a portion of the example method of FIG. 1, in accordance with embodiments of the present disclosure.

FIG. 29 illustrates the structure 300 following the performance of this portion of operation 112. As shown, gate contact material 356 has filled the remaining space in each of the channels. Additionally, the gate contact material 356 and surrounding conductive material 354 have been recessed to the same height. Subsequently, a cap 358 has been formed in each channel on top of the gate contact material 356 and conductive material 354 to seal each channel and complete each gate.

Following the performance of this portion of operation 112, the gates of the monolithic stacked FET are formed. Accordingly, following the performance of this portion, the performance of operation 112 is complete. Returning to FIG. 1, following the performance of operation 112, the method 100 proceeds with operation 116, wherein the component is finalized. In accordance with some embodiments of the present disclosure, the performance of operation 116 further includes the performance of a number of sub-operations.

In accordance with at least one embodiment of the present disclosure, the performance of operation 116 includes forming middle of line (MOL) contacts. In particular, the MOL contacts are formed such that an initial contact is formed so as to be electrically connected with the gate contact material of at least one of the gates. Moreover, the MOL contacts are formed such that an initial contact is arranged above the top device epitaxy material between each gate. In accordance with at least one embodiment of the present disclosure, the initial contact can include a layer of conductive material such as, for example, titanium, in direct contact with the gate contact material. In such embodiments, the initial contact can further include a further conductive material such as, for example, cobalt, arranged within the layer of conductive material.

Additionally, in accordance with at least one embodiment of the present disclosure, forming the MOL contacts can include forming a via so as to be electrically connected to the initial contact. In accordance with at least one embodiment of the present disclosure, the via can be formed of, for example, cobalt. In alternative embodiments, more than one via can be formed. For example, one via can be formed in electrical connection with each initial contact.

Additionally, in accordance with at least one embodiment of the present disclosure, forming the MOL contacts can include forming metal lines such that one of the metal lines is electrically connected to the via. In accordance with at least one embodiment of the present disclosure, the metal lines can be formed of, for example, copper. Forming the MOL contacts further includes forming corresponding layers of dielectric material to electrically isolate MOL contacts from one another and from the underlying FET structure.

FIG. 30 illustrates the structure 300 following the performance of this portion of operation 116. As illustrated in the center view of FIG. 30, initial contacts 360 are formed in direct electrical contact with the gate contact material 356. In between the gates, as illustrated by the rightmost view of FIG. 30, the initial contacts 360 do not extend through the cap 358. Additionally, vias 362 are formed in direct electrical contact with initial contacts 360, and metal lines 364 are formed in direct electrical contact with vias 362 to complete MOL contacts to enable functional integration of the structure 300.

The initial contacts 360, vias 362, and metal lines 364 are only illustrative examples of MOL contacts that can be made with the structure. In alternative embodiments, other MOL contacts can be used in the same or different arrangements.

In accordance with at least one embodiment of the present disclosure, the performance of operation 116 further includes flipping the wafer, including the MOL contacts and the stacked FET, and forming back end of line (BEOL) contacts on the opposite side of the structure. For example, a buried power rail can be formed so as to contact the bottom device epitaxy material by way of a buried power rail via. In accordance with at least one embodiment of the present invention, the buried power rail and buried power rail via can include, for example, a titanium liner and be filled with, for example cobalt.

FIG. 31 shows the structure following the performance of this portion of operation 116. As shown, the entire wafer produced by the performance of the previous processes and operations disclosed herein has been flipped and BEOL components have been formed such that a buried power rail 366 is in electrical contact with the bottom device epitaxy material 334 between each gate by way of a buried power rail via 368 that extends through the low-k dielectric material 326 that forms the bottom dielectric isolation layer for the bottom device. The buried power rails 366 and the buried power rail vias 368 are arranged in the substrate 302 of the structure 300 and are electrically isolated by an oxide layer 370 formed thereon.

The buried power rail 366 and buried power rail via 368 are only illustrative examples of BEOL contacts that can be made with the structure. In alternative embodiments, other BEOL contacts can be used in the same or different arrangements.

In accordance with at least one embodiment of the present disclosure, the performance of operation 116 further includes flipping the wafer again, back to its initial orientation, such that the wafer is ready to be used in a larger integrated circuit design. FIG. 32 shows the structure following the performance of this portion of operation 116. Following the performance of this portion, the performance of operation 116 is complete.

In addition to embodiments described above, other embodiments having fewer operational steps, more operational steps, or different operational steps are contemplated. Also, some embodiments may perform some or all of the above operational steps in a different order. Furthermore, multiple operations may occur at the same time or as an internal part of a larger process.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. However, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100*a*, 100*b*, 100*c*) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A semiconductor device, comprising:
   a bottom device including a first set of silicon sheets and a first source-drain epitaxy in direct contact with the first set of silicon sheets;
   a top device including a second set of silicon sheets, a set of separation layers, and a second source-drain epitaxy, each silicon sheet of the second set of silicon sheets separated by a separation layer of the set of separation layers, and the second source-drain epitaxy arranged in direct contact with the second set of silicon sheets; and
   a spacer arranged between the first source-drain epitaxy and the second source-drain epitaxy and arranged between each silicon sheet of the second set of silicon sheets.

2. The semiconductor device of claim 1, further comprising an isolation layer arranged in direct contact with the spacer.

3. The semiconductor device of claim 2, wherein the isolation layer extends farther than the second set of silicon sheets relative to the set of separation layers.

4. The semiconductor device of claim 2, wherein the spacer and the isolation layer form an uninterrupted separation between the bottom device and the top device.

5. The semiconductor device of claim 2, wherein:
   the spacer is formed of a first material; and
   the isolation layer is formed of a second material that is different than the first material.

6. The semiconductor device of claim 2, wherein the isolation layer includes an opening.

7. The semiconductor device of claim 6, wherein the spacer is arranged in the opening.

8. The semiconductor device of claim 7, wherein the spacer includes a seam arranged above the first source-drain epitaxy.

9. The semiconductor device of claim 8, wherein the second source-drain epitaxy is arranged above the seam.

10. The semiconductor device of claim 9, wherein the seam extends into the opening.

11. A method for forming a stacked transistor, the method comprising:
    forming a bottom device including a first set of silicon sheets and a first source-drain epitaxy in direct contact with the first set of silicon sheets;
    forming a top device including a second set of silicon sheets, a set of separation layers, and a second source-drain epitaxy, each silicon sheet of the second set of silicon sheets separated by a separation layer of the set of separation layers, and the source-drain epitaxy arranged in direct contact with the second set of silicon sheets; and forming a spacer arranged between the first source-drain epitaxy and the second source-drain epitaxy and arranged between the second source-drain epitaxy and the set of separation layers.

12. The method of claim 11, further comprising:
forming an isolation layer arranged in direct contact with the spacer.

13. The method of claim 12, wherein:
forming the top device includes forming the second set of silicon sheets such that the isolation layer extends farther than the second set of silicon sheets relative to the set of separation layers.

14. The method of claim 12, wherein:
forming the isolation layer includes forming an opening in the isolation layer; and
forming the spacer includes forming a portion of the spacer in the opening.

15. A stacked transistor, comprising:
a bottom device including a first plurality of silicon sheets and a bottom source-drain epitaxy;
a top device including a second plurality of silicon sheets and a top source-drain epitaxy;
a spacer arranged between the bottom source-drain epitaxy and the top source-drain epitaxy and arranged between the silicon sheets of the second plurality of silicon sheets.

16. The stacked transistor of claim 15, wherein:
the spacer is a single, continuous mass formed of one material.

17. The stacked transistor of claim 15, wherein:
the top device further includes a plurality of separation layers arranged such that a separation layer of the plurality of separation layers is arranged between each adjacent silicon sheet of the second plurality of silicon sheets; and
the spacer is arranged between each separation layer of the plurality of separation layers and the top source-drain epitaxy.

18. The stacked transistor of claim 17, wherein:
the plurality of separation layers is recessed relative to the second plurality of silicon sheets such that a recess is formed between each silicon sheet of the second plurality of silicon sheets; and
the spacer is arranged in each recess.

19. The stacked transistor of claim 15, further comprising:
an isolation layer arranged beneath the top source-drain epitaxy, wherein:
the isolation layer includes an opening, and
the spacer and the bottom source-drain epitaxy extend into the opening.

20. The stacked transistor of claim 19, wherein:
the spacer includes a seam that extends into the opening.

* * * * *